United States Patent
Xu et al.

(10) Patent No.: US 10,079,293 B2
(45) Date of Patent: Sep. 18, 2018

(54) SEMICONDUCTOR DEVICE HAVING A GAP DEFINED THEREIN

(71) Applicant: QUALCOMM Incorporated, San Diego, CA (US)

(72) Inventors: Jeffrey Junhao Xu, San Diego, CA (US); Kern Rim, San Diego, CA (US); John Jianhong Zhu, San Diego, CA (US); Stanley Seungchul Song, San Diego, CA (US); Mustafa Badaroglu, Leuven (BE); Vladimir Machkaoutsan, Wezemaal (BE); Da Yang, San Diego, CA (US); Choh Fei Yeap, Hsinchu (TW)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/839,050

(22) Filed: Dec. 12, 2017

(65) Prior Publication Data

US 2018/0114848 A1    Apr. 26, 2018

Related U.S. Application Data

(62) Division of application No. 14/341,568, filed on Jul. 25, 2014, now Pat. No. 9,871,121.

(Continued)

(51) Int. Cl.
*H01L 29/66* (2006.01)
*H01L 29/49* (2006.01)
*H01L 29/78* (2006.01)

(52) U.S. Cl.
CPC ...... *H01L 29/6681* (2013.01); *H01L 29/4991* (2013.01); *H01L 29/6653* (2013.01);

(Continued)

(58) Field of Classification Search
None
See application file for complete search history.

(56) References Cited

U.S. PATENT DOCUMENTS 6,180,988 B1    1/2001   Wu
6,737,716 B1    5/2004   Matsuo et al.
(Continued)

FOREIGN PATENT DOCUMENTS

JP    H1197674 A     4/1999
JP    2007200972 A   8/2007
WO    2006045722 A1  5/2006

OTHER PUBLICATIONS

Chan M., et al., "An Air Spacer Technology for Improving Short-Channel Immunity of MOSFETs With Raised Source/Drain and High-tex$kappa$/texGate Dielectric", IEEE Electron Device Letters, IEEE Service Center, New York, NY, US, vol. 26, No. 5, May 1, 2005 (May 1, 2005), pp. 323-325, XP011131289, ISSN: 8741-3186, DOI: 10.1109/LED.2005.846584 the whole document.

(Continued)

Primary Examiner — Whitney T Moore
(74) Attorney, Agent, or Firm — Qualcomm Incorporated-Toler

(57) ABSTRACT

A method includes forming a first spacer structure on a dummy gate of a semiconductor device and forming a sacrificial spacer on the first spacer structure. The method also includes etching a structure of the semiconductor device to create an opening, removing the sacrificial spacer via the opening, and depositing a material to close to define a gap.

23 Claims, 28 Drawing Sheets

Related U.S. Application Data

(60) Provisional application No. 61/950,681, filed on Mar. 10, 2014.

(52) U.S. Cl.
CPC .. *H01L 29/66545* (2013.01); *H01L 29/66795* (2013.01); *H01L 29/785* (2013.01)

(56) References Cited

U.S. PATENT DOCUMENTS

| | | |
|---|---|---|
| 7,091,567 B2 | 8/2006 | Park et al. |
| 7,691,712 B2 | 4/2010 | Chidambarrao et al. |
| 8,390,079 B2 | 3/2013 | Horak et al. |
| 8,428,048 B2 * | 4/2013 | Walker .................. H04H 20/26 370/352 |
| 8,471,343 B2 | 6/2013 | Doris et al. |
| 8,563,370 B2 | 10/2013 | Huang et al. |
| 8,637,384 B2 | 1/2014 | Ando et al. |
| 8,669,159 B2 | 3/2014 | Juengling |
| 2001/0007788 A1 | 7/2001 | Chang et al. |
| 2007/0296039 A1 | 12/2007 | Chidambarrao et al. |
| 2008/0254579 A1 | 10/2008 | Chi et al. |
| 2010/0025775 A1 | 2/2010 | Giles et al. |
| 2011/0049583 A1 | 3/2011 | Lin et al. |
| 2012/0037962 A1 | 2/2012 | Breyta et al. |
| 2012/0199886 A1 | 8/2012 | Horak et al. |
| 2012/0276711 A1 | 11/2012 | Yoon et al. |
| 2013/0299920 A1 | 11/2013 | Yin et al. |
| 2015/0255571 A1 | 9/2015 | Xu et al. |
| 2016/0365426 A1 | 12/2016 | Ching et al. |

OTHER PUBLICATIONS

International Preliminary Report on Patentability—PCT/US2015/018806, The International Bureau of WIPO—Geneva, Switzerland, dated Jun. 27, 2016.

Iternational Search Report and Written Opinion—PCT/US2015/018806—ISA/EPO—dated Jul. 28, 2015.

Park J., et al., "Improving CMOS Speed and Switching Power with Air-gap Structures," Electrical Engineering and Computer Sciences, University of California at Berkeley, Technical Report No. UCB/EECS-2011-84, Jul. 21, 2011, pp. 1-119.

Partial International Search Report—PCT/US2015/018806—ISA/EPO—dated May 22, 2015.

* cited by examiner

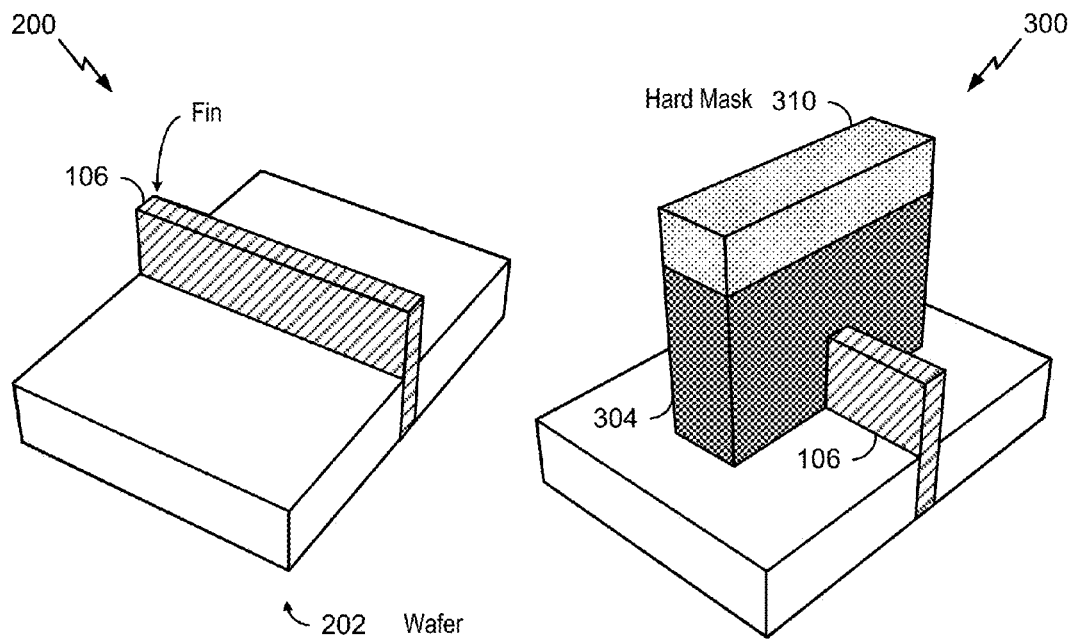
FIG. 2
FIG. 3
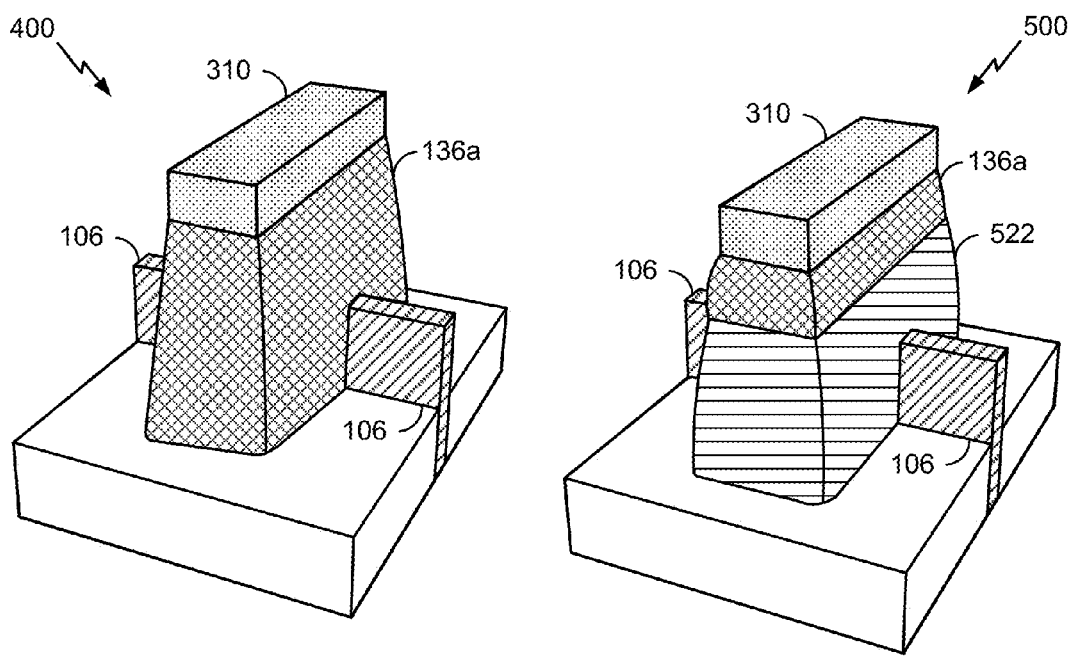
FIG. 4
FIG. 5

SEMICONDUCTOR DEVICE HAVING A GAP DEFINED THEREIN

I. CROSS-REFERENCE TO RELATED APPLICATIONS

The present application claims priority from and is a divisional application of pending U.S. Non-Provisional patent application Ser. No. 14/341,568 filed Jul. 25, 2014 and entitled "SEMICONDUCTOR DEVICE HAVING A GAP DEFINED THEREIN," which claims priority from commonly owned U.S. Provisional Patent Application No. 61/950,681 filed Mar. 10, 2014 and entitled "SEMICONDUCTOR DEVICE HAVING A GAP DEFINED THEREIN," the contents of each of which are expressly incorporated herein by reference in their entireties.

II. FIELD

The present disclosure is generally related to a semiconductor device having a gap defined therein.

III. DESCRIPTION OF RELATED ART

Advances in technology have resulted in smaller apparatuses and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Portable personal computing devices, such as wireless computing devices, may include a semiconductor device, such as a fin field-effect transistor (FinFET) device. The FinFET device may be formed with one or more fins. When a FinFET device includes a single fin, a shape of the fin may limit a drive strength (e.g., a current, such as an alternating current) of the FinFET to a relatively low level. To enable higher drive strengths, a FinFET device may be formed with multiple fins. However, the multiple fins may introduce parasitic capacitances that restrict (e.g., limit) alternating current performance of the FinFET device.

IV. SUMMARY

The present disclosure provides a semiconductor device having a gap (e.g., an air gap and/or a vacuum gap) defined therein. For example, a source/drain region of the semiconductor device may define the gap. A method of forming the semiconductor device, such as a FinFET device, may include depositing a first spacer material on a dummy gate (e.g., a sidewall of the dummy gate) of the semiconductor device. The method may also include depositing a sacrificial spacer on the first spacer material and depositing a second spacer material on the sacrificial spacer. The second spacer material may be in contact with the first spacer material. The method may further include removing the sacrificial spacer between the first spacer material and the second spacer material to create a cavity (having an opening) between the first spacer material and the second spacer material. For example, the sacrificial spacer material may be removed (e.g., etched) through the opening. The method may include filling the opening to establish a gap that is defined by a portion of the first spacer material and by a portion of the second spacer material. The opening may be filled (e.g., closed) with a third spacer material (e.g., a spacer cap) or a source/drain region material. The gap may be defined by a source/drain region of the semiconductor device. Additionally, the gap may be defined by the first spacer material, the second spacer material, the third spacer material, a substrate (e.g., a fin) of the semiconductor device, or a combination thereof, as illustrative, non-limiting examples. A height of the gap may be less than a height of a gate of the semiconductor device. The gap may enable a reduced parasitic capacitance and may increase a drive strength of the semiconductor device as compared to semiconductor devices that do not include a gap.

In a particular embodiment, a method includes forming a first spacer structure on a dummy gate of a semiconductor device and forming a sacrificial spacer on the first spacer structure. The method also includes etching a structure of the semiconductor device to create an opening, removing the sacrificial spacer through the opening and depositing a material to close the opening to define a gap.

In another particular embodiment, a semiconductor device includes a gate, a contact, and a source/drain region. The source/drain region is electrically coupled to the contact and defines a gap positioned between the gate and the contact. A height of the gap is less than a height of the gate.

In another particular embodiment, a non-transitory computer-readable medium includes instructions that, when executed by a processor, cause the processor to initiate formation of a semiconductor device. The semiconductor device formed by forming a first spacer structure on a dummy gate of a semiconductor device and by forming a sacrificial spacer on the first spacer structure. The semiconductor device is further formed by etching a structure to create an opening. The semiconductor device is further formed by removing the sacrificial spacer through the opening and by depositing a material to close the opening to define a gap.

In another particular embodiment, an apparatus includes means for activating a channel region of a semiconductor device. The channel region is coupled to a source/drain region of the semiconductor device. The apparatus further includes means for conducting current, the means for conducting coupled to the source/drain region. The source/drain region defines a gap positioned between the means for activating and the means for conducting. A height of the gap is less than a height of the means for activating the channel region.

One particular advantage provided by at least one of the disclosed embodiments is reduced parasitic capacitance (e.g., a gate capacitance) and an AC performance improvement as compared to devices (e.g., FinFETs) that do not have a defined gap. Another particular advantage provided by at least one of the disclosed embodiments is that a FinFET transistor delay time may be reduced and/or a switch energy may be reduced as compared to FinFET devices that do not have a defined gap.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 2 is a first illustrative diagram of at least one stage of a first process of fabricating a semiconductor device including a source/drain region that defines a gap;

FIG. 3 is a second illustrative diagram of at least one stage of the first process of fabricating the semiconductor device after forming a hardmask on a dummy gate;

FIG. 4 is a third illustrative diagram of at least one stage of the first process of fabricating the semiconductor device after forming a first spacer structure;

FIG. 5 is a fourth illustrative diagram of at least one stage of the first process of fabricating the semiconductor device after forming a sacrificial spacer;

VI. DETAILED DESCRIPTION

Particular embodiments of the present disclosure are described below with reference to the drawings. In the description, common features are designated by common reference numbers throughout the drawings.

Figure 1A:
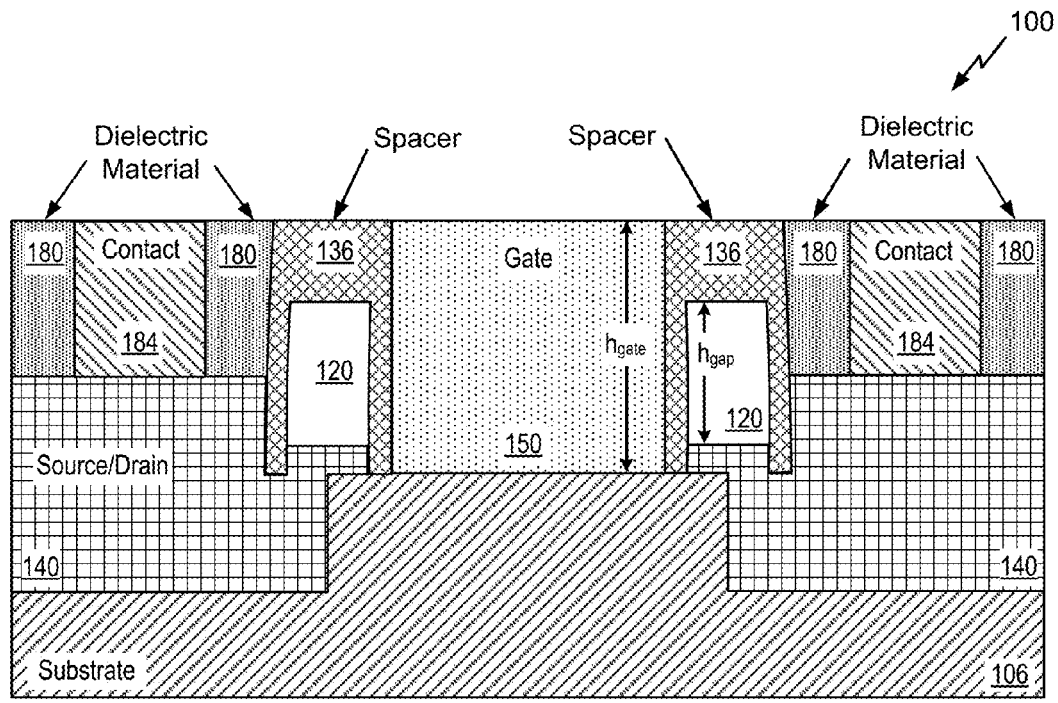
FIG. 1A is a diagram of a partial view of a first semiconductor device including a source/drain region that defines a gap.

Referring to FIG. 1A, a diagram of a semiconductor device 100 having a gap defined therein is shown. The semiconductor device 100 may include or correspond to a field-effect transistor (FET) device, such as a FinFET device that includes one or more fins, a metal-oxide semiconductor (MOS) device, such as p-type metal-oxide-semiconductor (pMOS) device or an n-type metal-oxide-semiconductor (nMOS) device, as illustrative, non-limiting examples.

The semiconductor device 100 may include a substrate 106, one or more source/drain regions 140, dielectric material 180 (e.g. a dielectric layer), one or more contacts 184, a spacer 136, and a gate 150. The substrate 106 may be associated with and/or formed from a wafer, such as a silicon wafer, as an illustrative, non-limiting example. The substrate 106 may include a silicon (Si) substrate. The substrate 106 may include a fin portion that is associated with a channel region of the semiconductor device 100.

The gate 150 may be coupled to (e.g., in contact with) the substrate 106, such as coupled to the fin portion of the substrate 106. The gate 150 may include a conformal oxide layer (e.g., a high K (HiK) material), gate material (e.g., a metal), or a combination thereof. The gate 150 may have a height $h_{gate}$. The height $h_{gate}$ of the gate 150 may be determined relative to a surface of the substrate 106. For example, the height $h_{gate}$ of the gate 150 may be determined based on a distance from a top surface of the gate 150 to a bottom surface of the gate 150. The bottom surface of the gate 150 may be in contact with a surface of the substrate 106, such as a surface of a channel region of the substrate 106.

Although the semiconductor device 100 is illustrated as having two source/drain (S/D) regions 140, one of the source/drain regions 140 may be designated as a source region and the other source/drain region 140 may be designated as a drain region. Each of the source/drain regions 140 may be coupled to a corresponding contact 184. The contact 184 may include a metal. Each contact 184 may be in contact with a corresponding source/drain region 140. Alternatively or additionally, each contact 184 may be electrically coupled to a corresponding source/drain region 140 through one or more structures, such as through a silicide.

A spacer 136 may be positioned between the gate 150 and the contact 184. Although the spacer 136 is illustrated as a single spacer structure, the spacer 136 may include one or more sub-structures, as described further herein with reference to FIG. 1B. The spacer 136 may include one or more materials, such as an oxide or a nitride (e.g., a nitride including silicon (Si), carbon (C), boron (B), or a combination thereof), as illustrative, non-limiting examples.

Figure 1B:
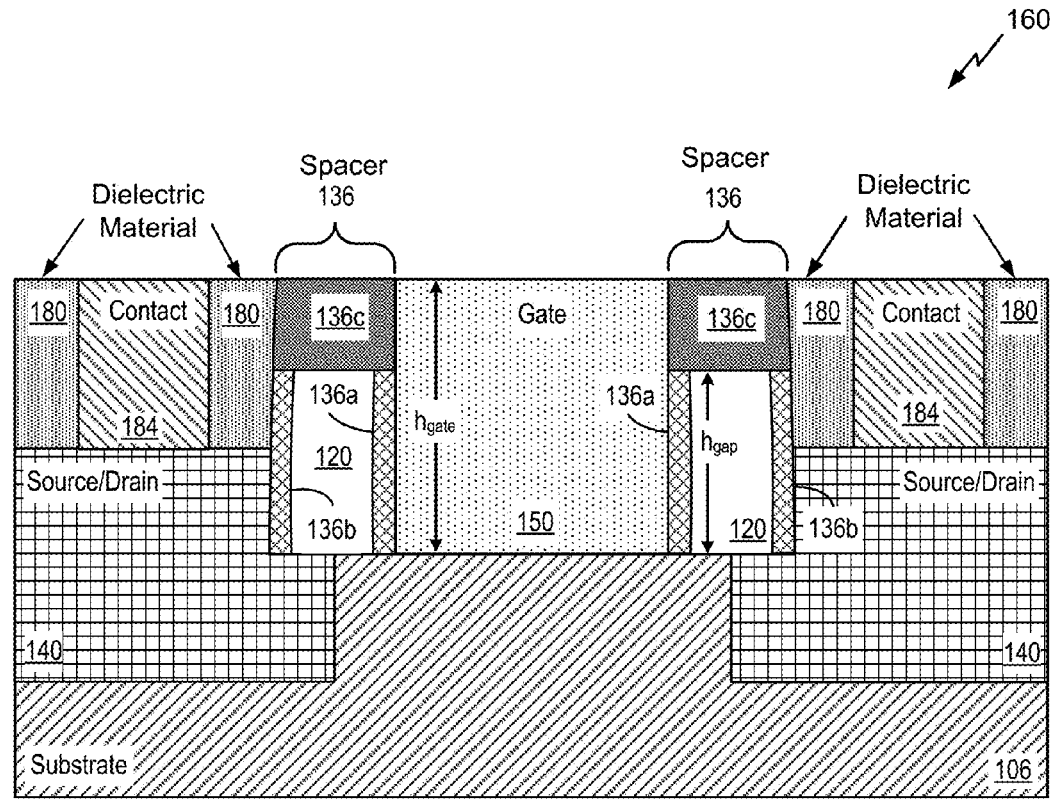
FIG. 1B is a diagram of a partial view of a second semiconductor device including a source/drain region that defines a gap.

One or more components (e.g., one or more structures) of the semiconductor device 100 may define the gap 120. For example, as illustrated in FIG. 1A, the spacer 136 and one or more source/drain regions 140 define the gap 120. Additionally, as illustrated in FIG. 1B, the substrate 106 may also define the gap 120. The gap 120 may have a height $h_{gap}$. The height $h_{gap}$ of the gap 120 may be determined based on a distance from a top boundary of the gap 120 to a bottom boundary of the gap 120. The top boundary of the gap 120 may be established by a surface of the spacer 136. The bottom boundary of the gap 120 may be established by a surface of the source/drain region 140. The height $h_{gap}$ of the gap 120 is less than the height $h_{gate}$ of the gate 150.

During operation of the semiconductor device 100, the gate 150 and the contact 184 (e.g., source/drain electrodes) of the semiconductor device 100 may be biased in accordance with operation of the semiconductor device 100. When the semiconductor device 100 is in an on state, the gate 150 may activate a channel region to enable a carrier path from a first source/drain region 140 (e.g., a source region) to a second source/drain region 140 (e.g., the drain region), such as a carrier path through the substrate 106 (e.g., through a fin of the semiconductor device 100). When the semiconductor device 100 is in an off state, the gate 150 may not activate the channel region and the carrier path may not be enabled (e.g., the carrier path is disabled in a subthreshold regime of operation).

By having the gap 120, such as an air-filled gap or a vacuum gap, the semiconductor device 100 may advantageously include a reduced parasitic capacitance (e.g., a gate capacitance) and an AC performance improvement as compared to FinFET devices that have multiple fins and do not have a defined gap. Additionally, a FinFET transistor delay time and/or a switch energy associated with the semiconductor device 100 may advantageously be reduced.

Referring to FIG. 1B, a diagram of a semiconductor device 100 having a gap defined therein is shown. The semiconductor device 160 may include or correspond to the semiconductor device 100 of FIG. 1A. For example, the semiconductor device 100 may include or correspond to a field-effect transistor (FET) device, such as a FinFET device.

The spacer 136 may include one or more sub-structures, such a first spacer structure 136a, a second spacer structure 136b, and a third spacer structure 136c. Although the spacer 136 is illustrated as including three sub-structures, the spacer 136 may include less than three sub-structures or more than three sub-structures.

The first spacer structure 136a may include an oxide or silicon nitride and the second spacer structure 136b may include an oxide or silicon nitride, as illustrative, non-limiting examples. A first spacer material of the first spacer structure 136a and a second spacer material of the second spacer structure 136b may be the same material or may be different materials. The third spacer structure 136 may include a third spacer material, such as a nitride (e.g., a nitride including silicon (Si), carbon (C), boron (B), or a combination thereof), as illustrative, non-limiting examples.

The height $h_{gap}$ of the gap 120 may be determined based on a distance from a top boundary of the gap 120 to a bottom boundary of the gap 120. The top boundary of the gap 120 may be established by a surface of the spacer 136, such as a surface of the third spacer structure 136c. The bottom boundary of the gap 120 may be established by a surface of the source/drain region 140 and/or a surface of the substrate 106 (e.g., a surface of a channel region of the substrate 106). The height $h_{gap}$ of the gap 120 is less than the height $h_{gate}$ of the gate 150.

The semiconductor device 160 may operate in a similar manner as the semiconductor device 100. The semiconductor device 160 may advantageously include a reduced parasitic capacitance (e.g., a gate capacitance) and an AC performance improvement as compared to FinFET devices that have multiple fins and that do not have a defined gap. Additionally, a FinFET transistor delay time and/or a switch energy associated with the semiconductor device 160 may advantageously be reduced.

Referring to FIG. 2, a first illustrative diagram of at least one stage of a first process of fabricating a semiconductor device that includes a source/drain region that defines a gap is depicted and generally designated 200. The semiconductor device, such as a FinFET device, may correspond to the semiconductor device 100 of FIG. 1A. A wafer 202 as depicted in FIG. 2 is illustrated after performing shallow trench isolation (STI) on the wafer 202 to form a fin. For example, the wafer 202 may be etched during the STI to form the fin. The wafer 202 may include a substrate 106, such as a silicon (Si) substrate, as an illustrative, non-limiting example. Accordingly, the fin may include silicon (Si). Although a single fin is illustrated, the substrate 106 may include more than one fin.

Referring to FIG. 3, a second illustrative diagram of at least one stage of the first process of fabricating the semiconductor device after forming a hardmask on a dummy gate is depicted and generally designated 300. A dummy gate 304 may be formed above the wafer 202 (e.g., above the substrate 106). For example, the dummy gate 304 may be formed on at least a portion of the fin. To illustrate, the dummy gate 304 may be deposited on the wafer 202 and on the substrate 106. The dummy gate 304 may include amorphous silicon (a-Si) or polysilicon, as illustrative, non-limiting examples. A hardmask 310 may be formed above the dummy gate 304. For example, the hardmask 310 may be deposited on a surface (e.g., a top) of the dummy gate 304. The hardmask 310 may include an oxide.

Referring to FIG. 4, a third illustrative diagram of at least one stage of the first process of fabricating the semiconductor device after forming a first spacer material is depicted and generally designated 400. A first spacer structure 136a may be formed on the dummy gate 304. For example, the first spacer structure 136a may be formed by depositing a first spacer material on the dummy gate 304. The first spacer structure 136a may be deposited on a sidewall of the dummy gate 304, such that the first spacer structure 136a is in contact with the dummy gate 304. The first spacer structure 136a may be formed above the wafer 202 and above the substrate 106. The first spacer structure 136a (e.g., the first spacer material) may include silicon nitride (SiN) or an oxide. Etching may be performed as part of or in addition to formation of the first spacer structure 136a.

Referring to FIG. 5, a third illustrative diagram of at least one stage of the first process of fabricating the semiconductor device after forming a sacrificial spacer is depicted and generally designated 500. A sacrificial spacer 522 may be conformally formed on at least a portion of the first spacer structure 136a. The sacrificial spacer 522 may be formed above the wafer 202 and above the substrate 106. The sacrificial spacer 522 may include a material that includes carbon. A cross sectional thickness of the sacrificial spacer 522 may be greater than a cross sectional thickness of the first spacer structure 136a.

Etching may be performed as part of or in addition to formation of the sacrificial spacer 522. For example, the sacrificial spacer 522 may be etched to expose a portion of a surface of the first spacer structure 136a. Alternatively, after etching the sacrificial spacer 522, the sacrificial spacer 522 may cover an entirety of the first spacer structure 136a.

Figure 6:
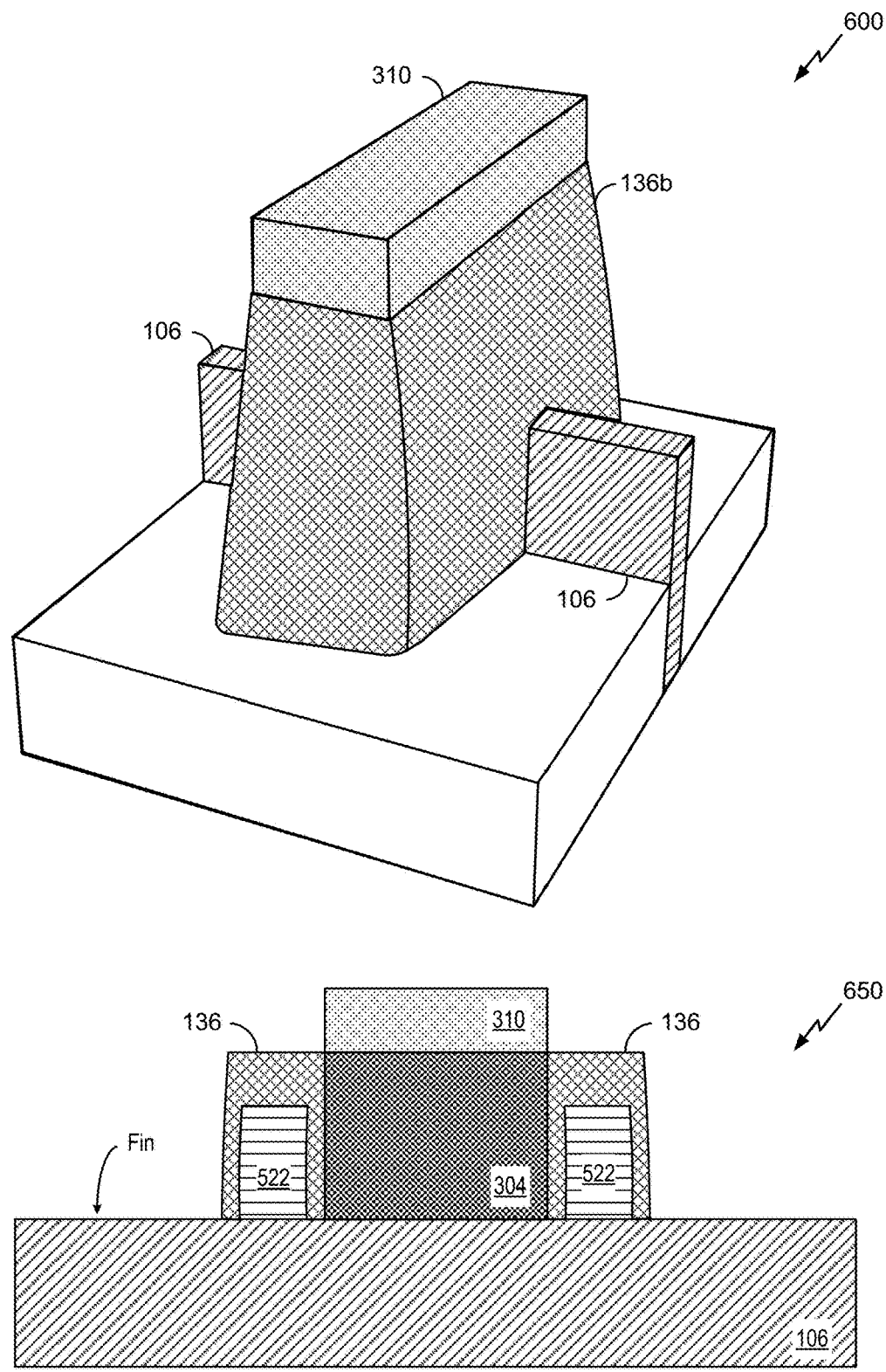
FIG. 6 is a fifth illustrative diagram of at least one stage of the first process of fabricating the semiconductor device after forming a second spacer structure.

Referring to FIG. 6, a fifth illustrative diagram of at least one stage of the first process of fabricating the semiconductor device after forming a second spacer material is depicted and generally designated 600. FIG. 6 also includes a cross section 650 through the fin of the semiconductor device. A second spacer structure 136b may be formed on first spacer structure 136a and/or the sacrificial spacer 522. For example, a second spacer material of the second spacer structure 136b may be deposited on the first spacer structure 136a and the sacrificial spacer 522, such that the second spacer structure 136b is in contact with a portion of a surface of the first spacer structure 136a and at least a portion of a surface of the sacrificial spacer 522. When the second spacer structure 136b and the first spacer structure 136a are in contact, the first spacer structure 136a and the second spacer structure 136b may be referred to collectively as a spacer 136. The second spacer structure 136b may be formed above the wafer 202 and above the substrate 106. Accordingly, the sacrificial spacer 522 may be positioned between the first spacer structure 136a and the second spacer structure 136b.

The second spacer material of the second spacer structure 136b may include the same material as the first spacer material of the first spacer structure 136a or may be a different material than the first spacer material. For example, the second spacer material may include silicon nitride (SiN) or an oxide. Etching may be performed as part of or in addition to formation of the second spacer structure 136b. A cross sectional thickness of the second spacer structure 136b may be less than a cross sectional thickness of the sacrificial spacer 522.

Figure 7:
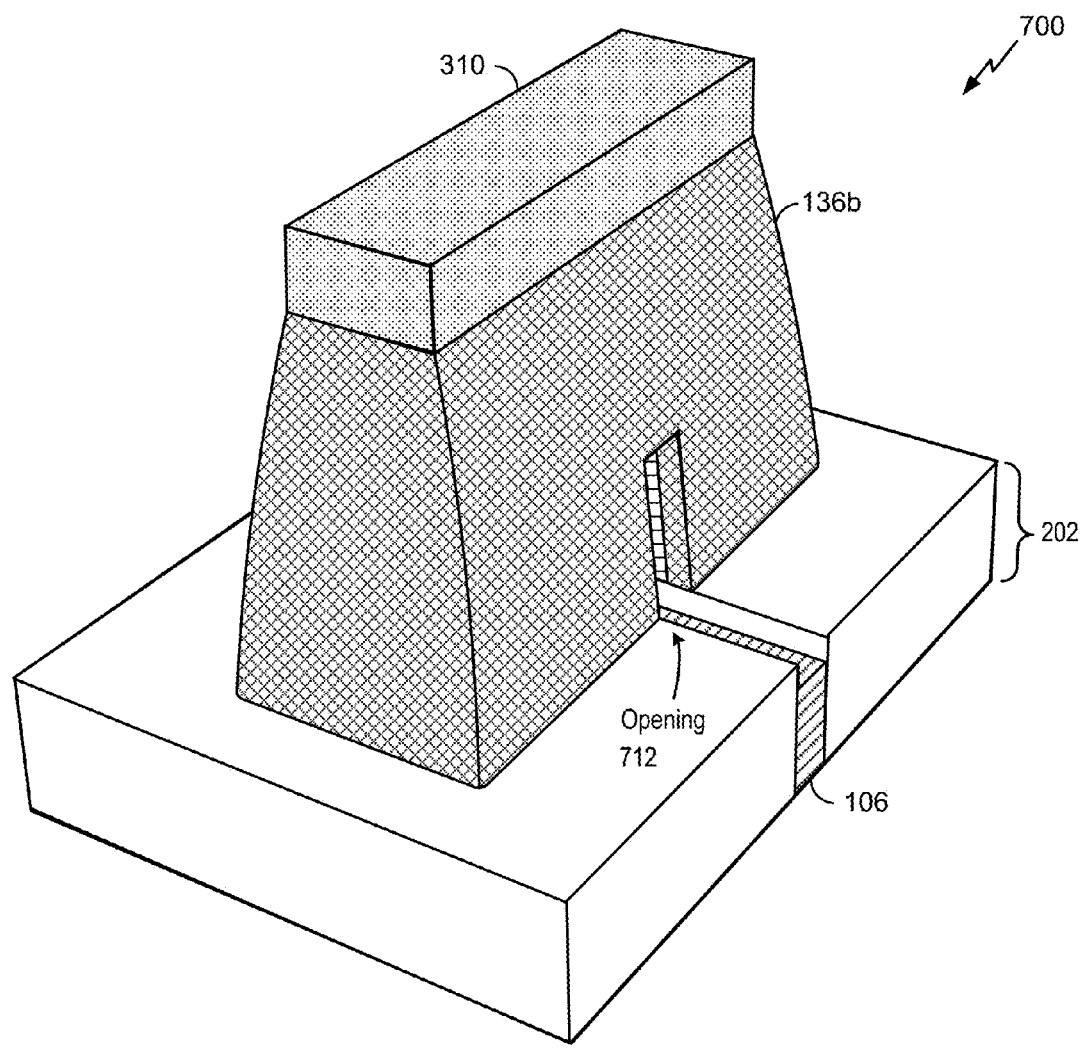
FIG. 7 is a sixth illustrative diagram of at least one stage of the first process of fabricating the semiconductor device after removing a portion of a fin of the semiconductor device.
Figure 7:
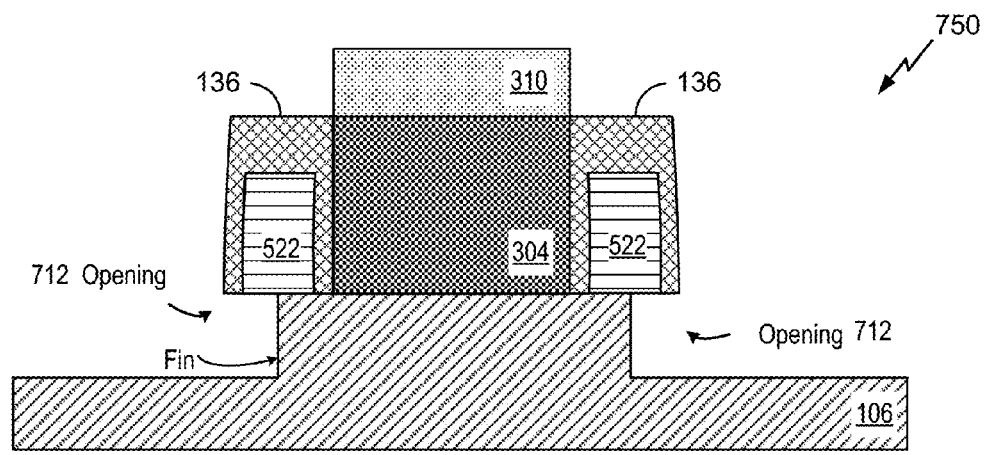

Referring to FIG. 7, a sixth illustrative diagram of at least one stage of the first process of fabricating the semiconductor device after removing a portion of a fin of the semiconductor device is depicted and generally designated 700. FIG. 7 also includes a cross section 750 through the fin of the semiconductor device. A portion of the substrate 106, such as a portion of the fin, associated with a source/drain (S/D) region may be removed. For example, the portion of the substrate 106 (e.g., the fin) may be etched (e.g., recessed) that is associated with one or more S/D regions while another portion of the substrate 106 associated with a channel region is not removed. After the portion of the substrate 106 is etched, a surface of the portion of the substrate 106 may be lower than a surface of the wafer 202. The removal of the portion of the substrate 106 may include removing a particular portion of the fin that is in contact with the second spacer structure 136b. The removal of the particular portion of the fin that is in contact with the second spacer structure 136b may expose a portion of the sacrificial spacer 522. Additionally, another particular portion of the fin that is in contact with the sacrificial spacer 522 may also be etched. The removal of the portion of the substrate may establish an opening 712 through which the sacrificial spacer 522 may be removed.

Figure 8:
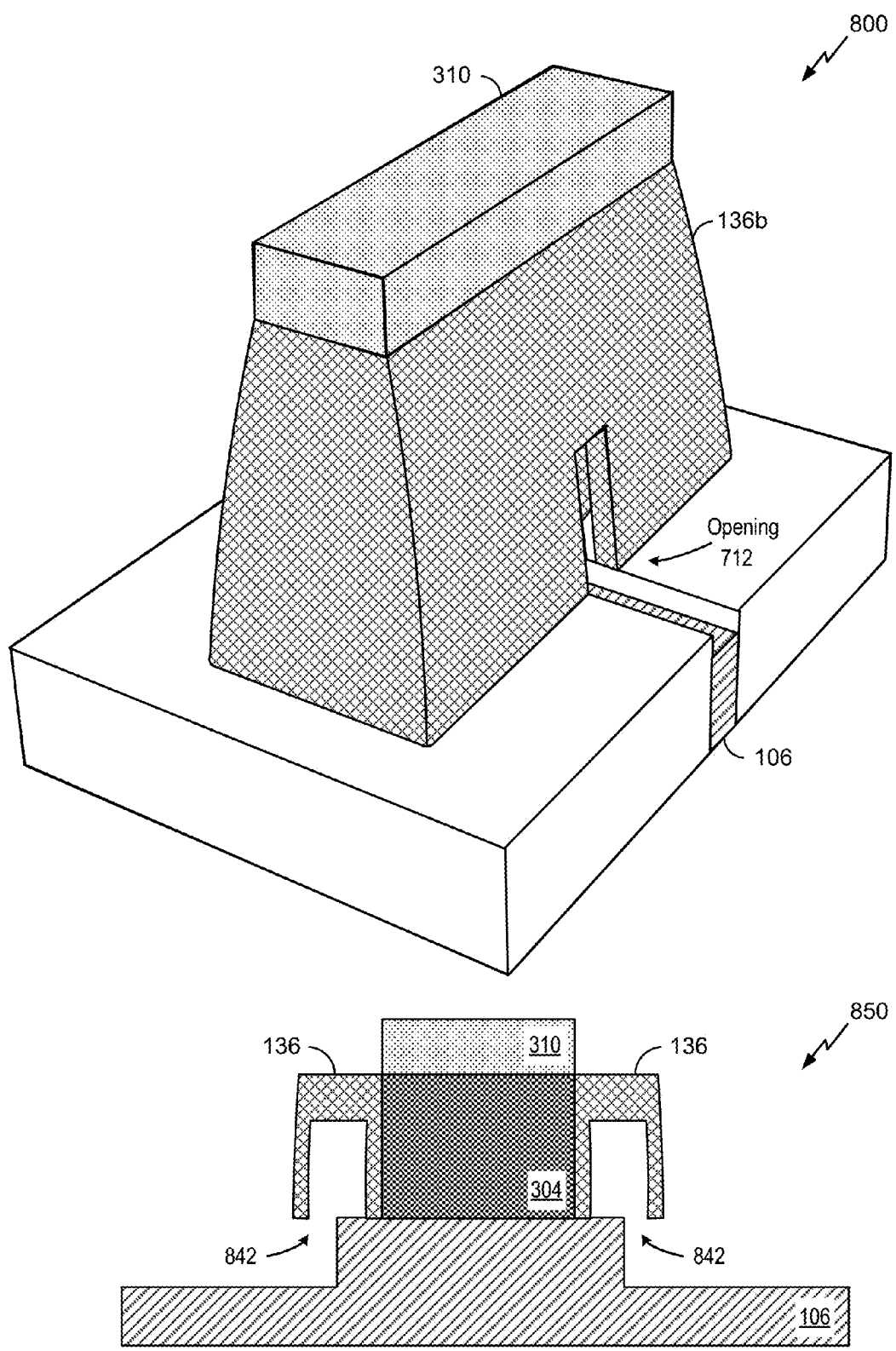
FIG. 8 is a seventh illustrative diagram of at least one stage of the first process of fabricating the semiconductor device after removing the sacrificial spacer.

Referring to FIG. 8, a seventh illustrative diagram of at least one stage of the first process of fabricating the semiconductor device after removing the sacrificial spacer is depicted and generally designated 800. FIG. 8 also illustrates a cross section 850 through the fin of the semiconductor device. The sacrificial spacer 522 may be removed using a chemical or reactive gas chemistry. For example, a hydrogen reaction or a standard clean 1 type may be used to remove the sacrificial spacer 522 without performing an etch operation. Removal of the sacrificial spacer 552 may not affect (e.g., may not remove) the first spacer structure 136a or the second spacer structure 136b. Removal of the sacrificial spacer 522 may create a cavity 842 that is defined by the first spacer structure 136a and the second spacer structure 136b. The cavity 842 may also be defined by the substrate 106 (e.g., the fin) and/or the wafer 202.

Figure 9:
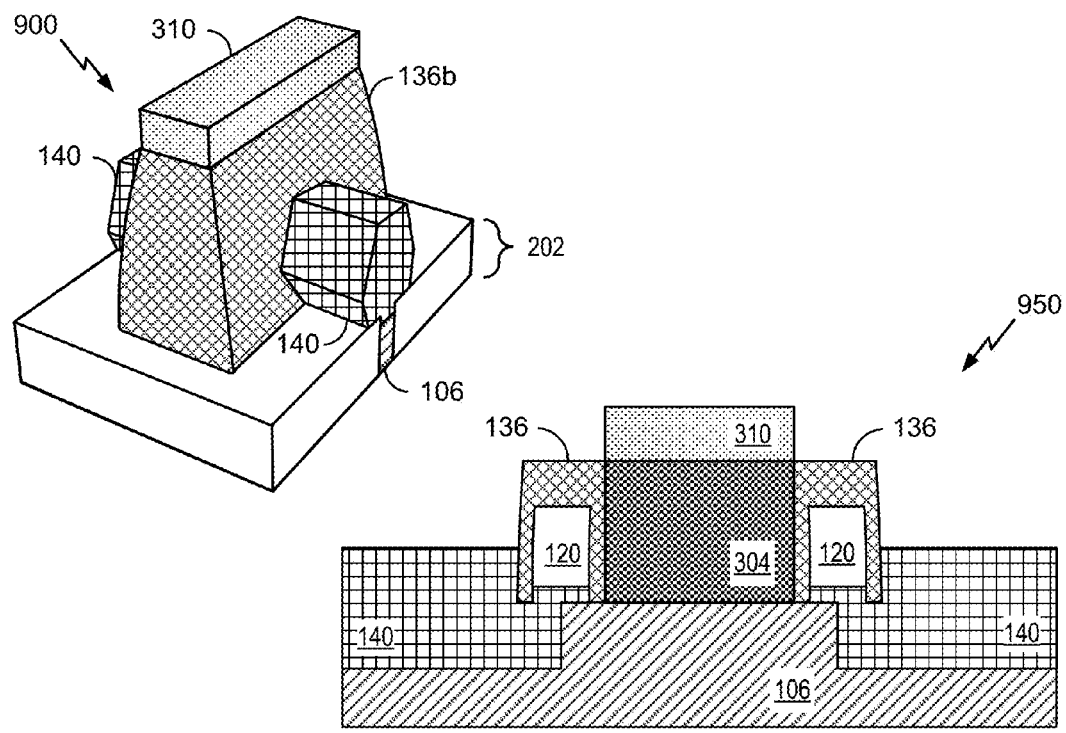
FIG. 9 is an eighth illustrative diagram of at least one stage of the first process of fabricating the semiconductor device after forming a source/drain region.

Referring to FIG. 9, an eighth illustrative diagram of at least one stage of the first process of fabricating the semiconductor device after forming a source/drain region is depicted and generally designated 900. FIG. 9 also illustrates a cross section 950 through the fin of the semiconductor device. A source/drain (SD) region 140 may be formed (e.g., raised) above a recessed portion of the substrate 106 (e.g., the fin) and/or above the wafer 202. For example, the source/drain (SD) region 140 may be epitaxially deposited (e.g., epitaxially grown) on the portion of the substrate 106 (e.g., the fin). The S/D region 140 may extend at least part way into the cavity 842 of FIG. 8 and may block (e.g., close) the opening 712 through which the sacrificial spacer 522 was removed. By closing the opening 712 through which the sacrificial spacer 522 was removed, a gap 120 (e.g., an air-gap or a vacuum gap) may be defined by at least a portion of the spacer 136 (e.g., the first spacer structure 136a and the second spacer structure 136b). The gap 120 may further be defined by the wafer 202 and/or the S/D region 140. Additionally or alternatively, the gap 120 may further be defined by the substrate 106 (e.g., the fin).

Figure 10:
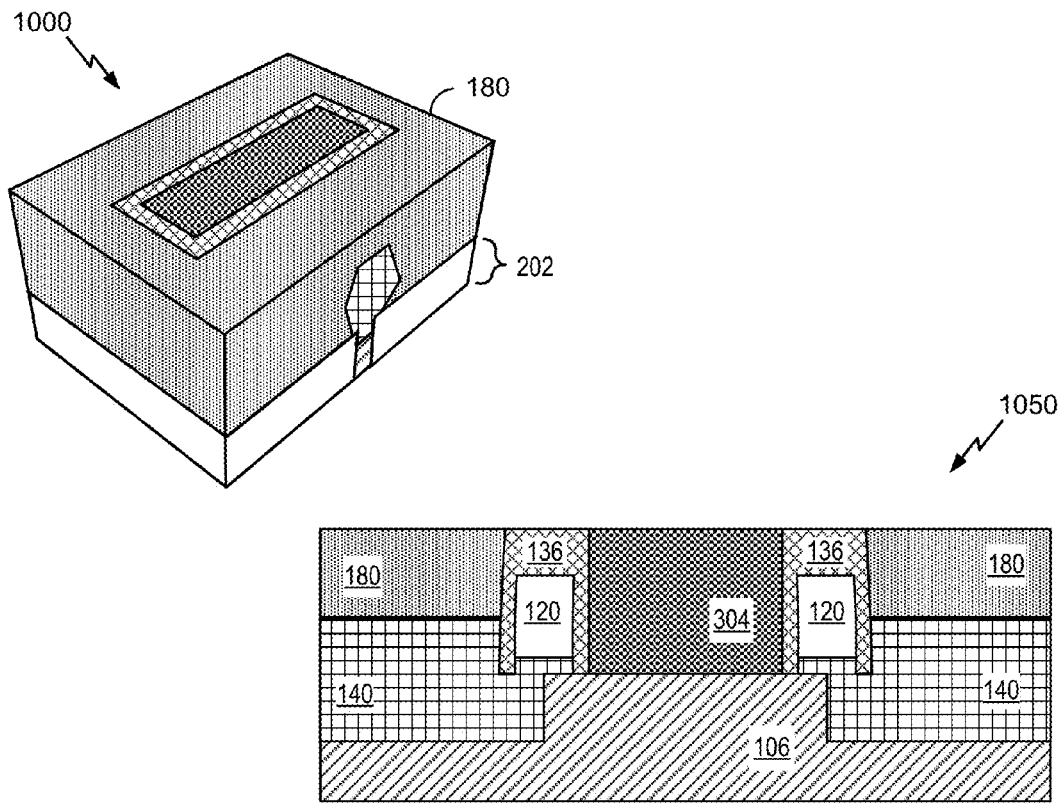
FIG. 10 is a ninth illustrative diagram of at least one stage of the first process of fabricating the semiconductor device after a dielectric material is deposited and after planarization is performed.

Referring to FIG. 10, a ninth illustrative diagram of at least one stage of the first process of fabricating the semiconductor device after a dielectric material is deposited and after planarization is performed is depicted and generally designated 1000. FIG. 10 also illustrates a cross section 1050 through the fin of the semiconductor device. A dielectric material 180 may be deposited above the wafer 202. For example, the dielectric material 180 may include a silicon-containing material. After the dielectric material 180 is deposited, a chemical mechanical planarization (CMP) (e.g., a chemical mechanical polish) may be performed to remove a portion of the dielectric material 180 and the hardmask 310. By removing the hardmask 310, the CMP may expose the dummy gate 304, such as a top surface of the dummy gate 304.

Figure 11:
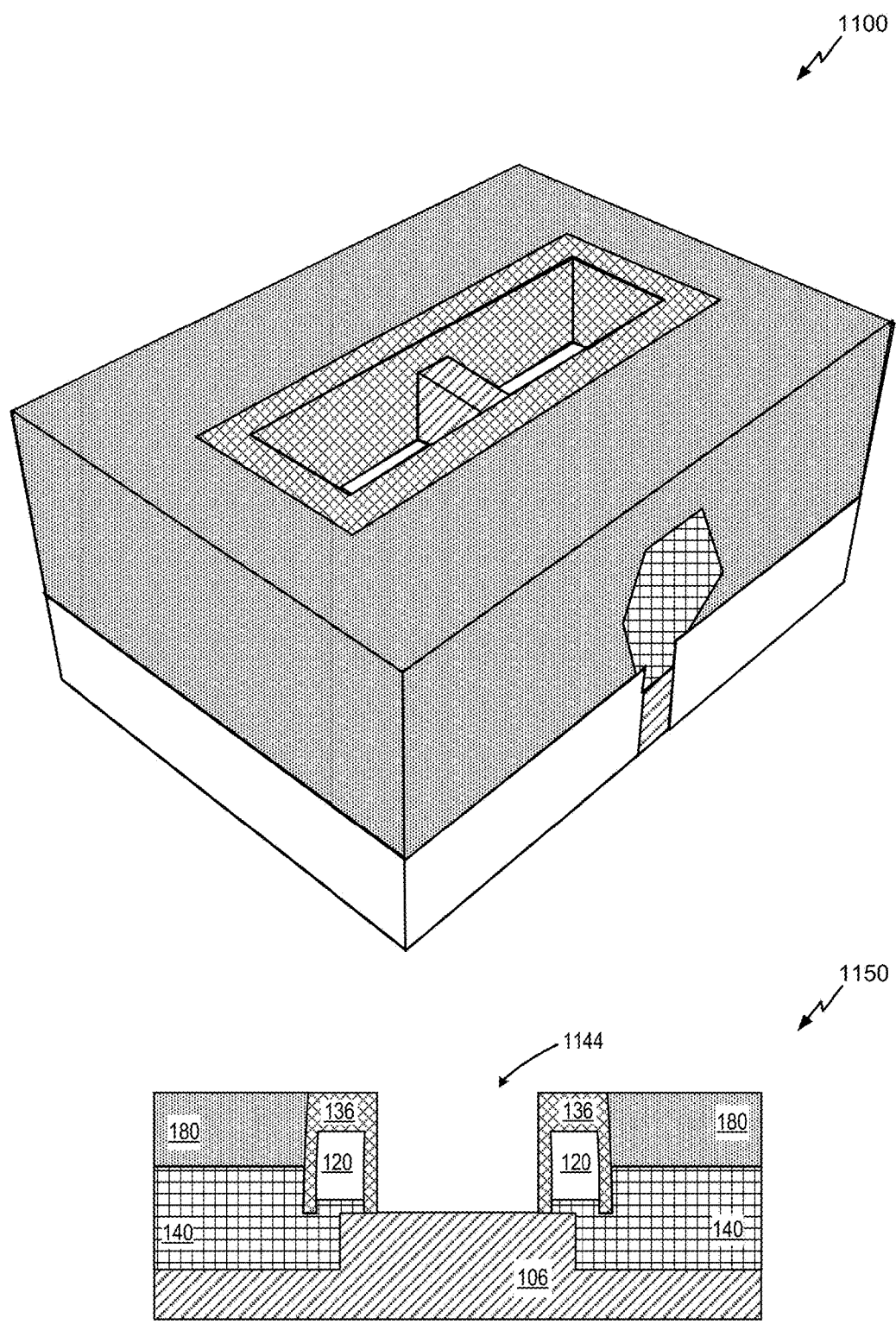
FIG. 11 is a tenth illustrative diagram of at least one stage of the first process of fabricating the semiconductor device after the dummy gate is removed.

Referring to FIG. 11, a tenth illustrative diagram of at least one stage of the first process of fabricating the semiconductor device after the dummy gate is removed is depicted and generally designated 1100. FIG. 11 also illustrates a cross section 1150 through the fin of the semiconductor device. The dummy gate 304 may be removed to establish (e.g., form) a cavity 1144. For example, the dummy gate 304 may be etched out to expose at least a portion of the substrate 106 (e.g., the fin) associated with a channel region. The dummy gate 304 may be removed using a dry etch, a wet etch, or a combination thereof.

Figure 12:
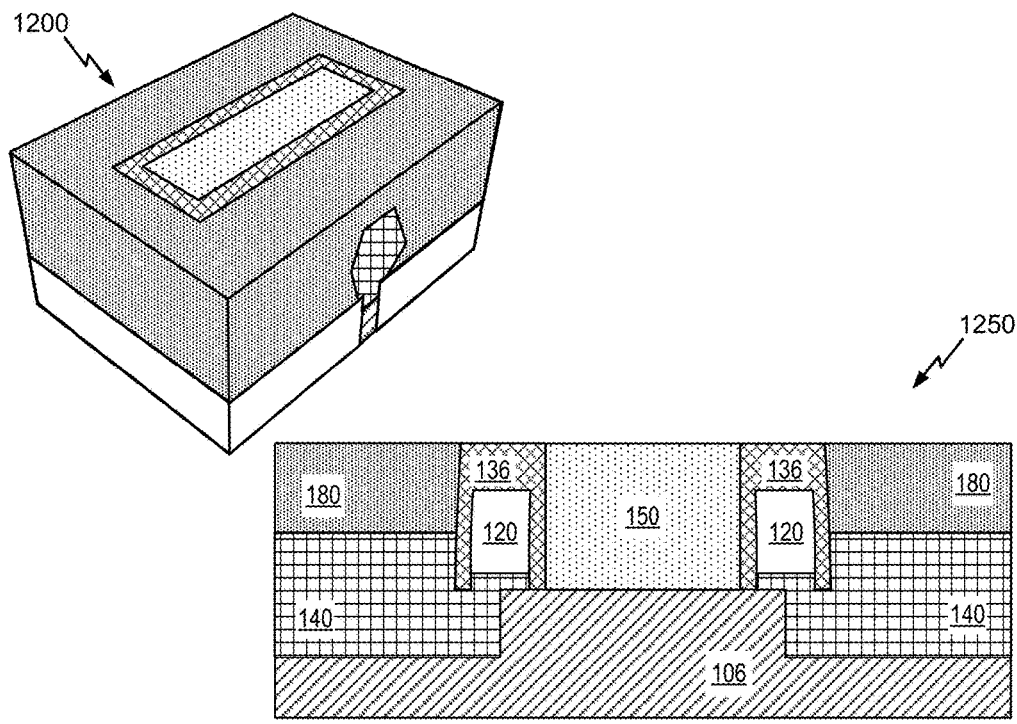
FIG. 12 is an eleventh illustrative diagram of at least one stage of the first process of fabricating the semiconductor device after forming a gate.

Referring to FIG. 12, an eleventh illustrative diagram of at least one stage of the first process of fabricating the semiconductor device after forming a gate is depicted and generally designated 1200. FIG. 12 also illustrates a cross section 1250 through the fin of the semiconductor device. A gate 150 may be formed (e.g., deposited) in the cavity 1144 of FIG. 11. For example, the gate 150 may be formed on (e.g., over) a portion of the substrate 106 (e.g., the fin) that is exposed in the cavity 1144 of FIG. 11. The gate 150 may include a high-k material. Although illustrated as a single material layer, the gate 150 may include one or more layers (e.g., one or more materials), such as an oxide layer, a high-k gate dielectric, and/or a metal gate layer (e.g., a metal gate material), as illustrative, non-limiting embodiments.

Figure 13:
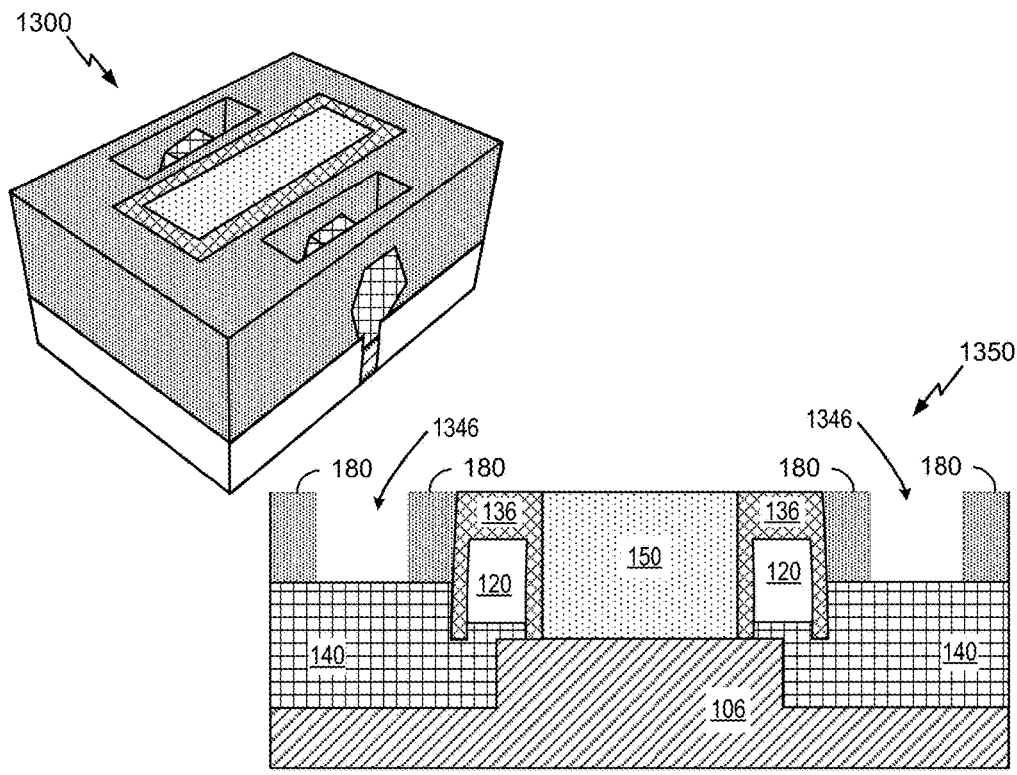
FIG. 13 is a twelfth illustrative diagram of at least one stage of the first process of fabricating the semiconductor device after forming a cavity.

Referring to FIG. 13, a twelfth illustrative diagram of at least one stage of the first process of fabricating the semiconductor device after forming a cavity is depicted and generally designated 1300. FIG. 13 also illustrates a cross section 1350 through the fin of the semiconductor device. Contact patterning may be performed to create a cavity 1346. For example, an etch process may be used to create the cavity 1346 (e.g., a trench) and to expose a portion (e.g. a surface) of the S/D region 140. The cavity 1346 may not expose a portion of the spacer 136, such as a surface of the second spacer structure 136b.

Figure 14:
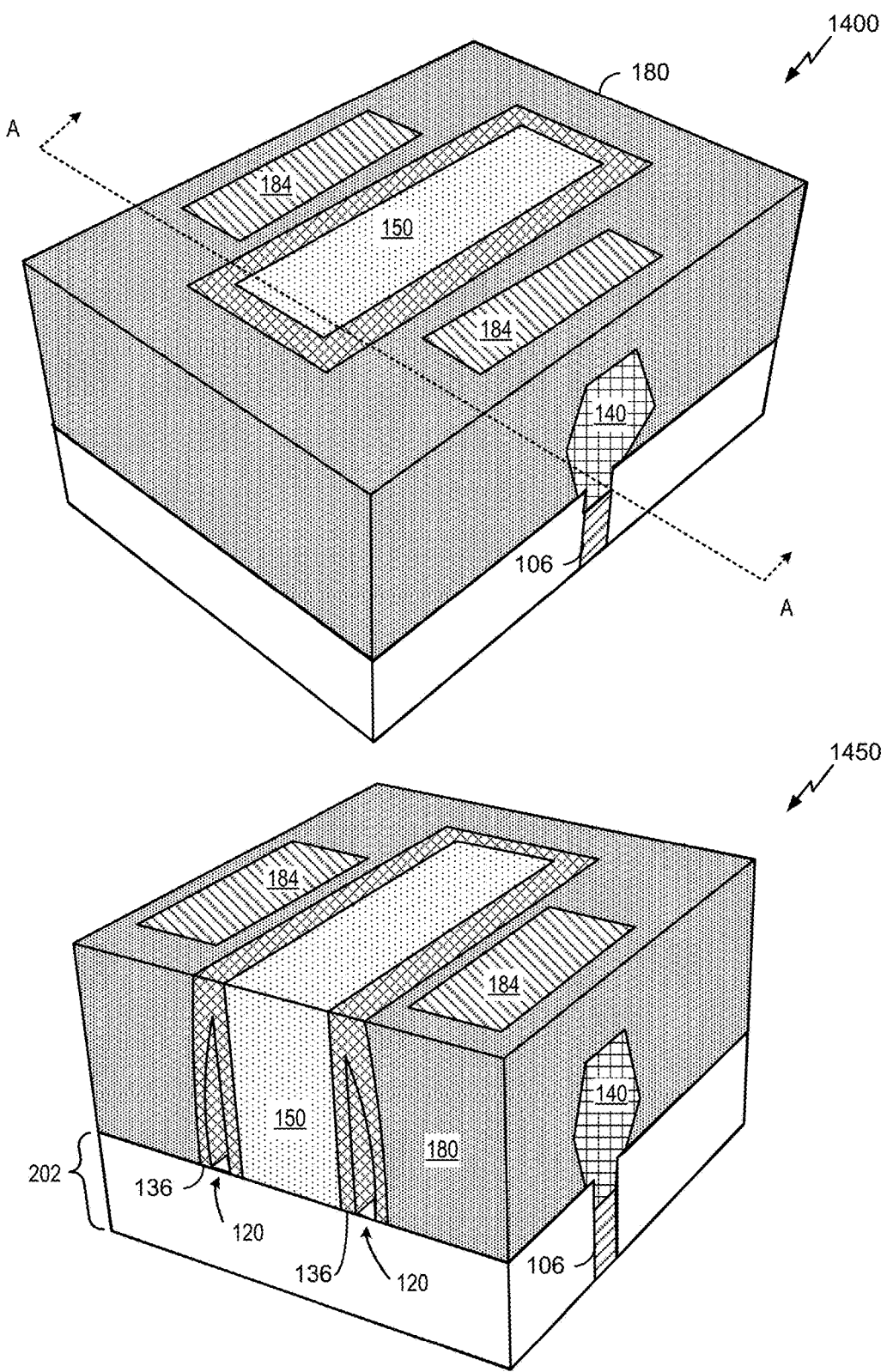
FIG. 14 is a thirteenth illustrative diagram of at least one stage of the first process of fabricating the semiconductor device after forming a contact.

Referring to FIG. 14, a thirteenth illustrative diagram of at least one stage of the first process of fabricating the semiconductor device after forming a contact is depicted and generally designated 1400. FIG. 14 also illustrates a cross section 1450 through a line A-A of the semiconductor device. A contact 184 may be formed in the cavity 1346 of FIG. 13. In a particular embodiment, the contact 184 does not touch the spacer 136. The contact 184 may include a metal material. The semiconductor device of FIG. 14 may include or correspond to the semiconductor device 100 of FIG. 1A.

The semiconductor device may advantageously include the spacer 136 that defines the gap 120. The gap 120 may reduce a parasitic capacitance (e.g., a gate capacitance, such as a capacitance between the gate 150 and the contact 184). Additionally, the gap 120 may provide an AC performance improvement as compared to FinFET devices that do not have a defined gap.

Figure 15:
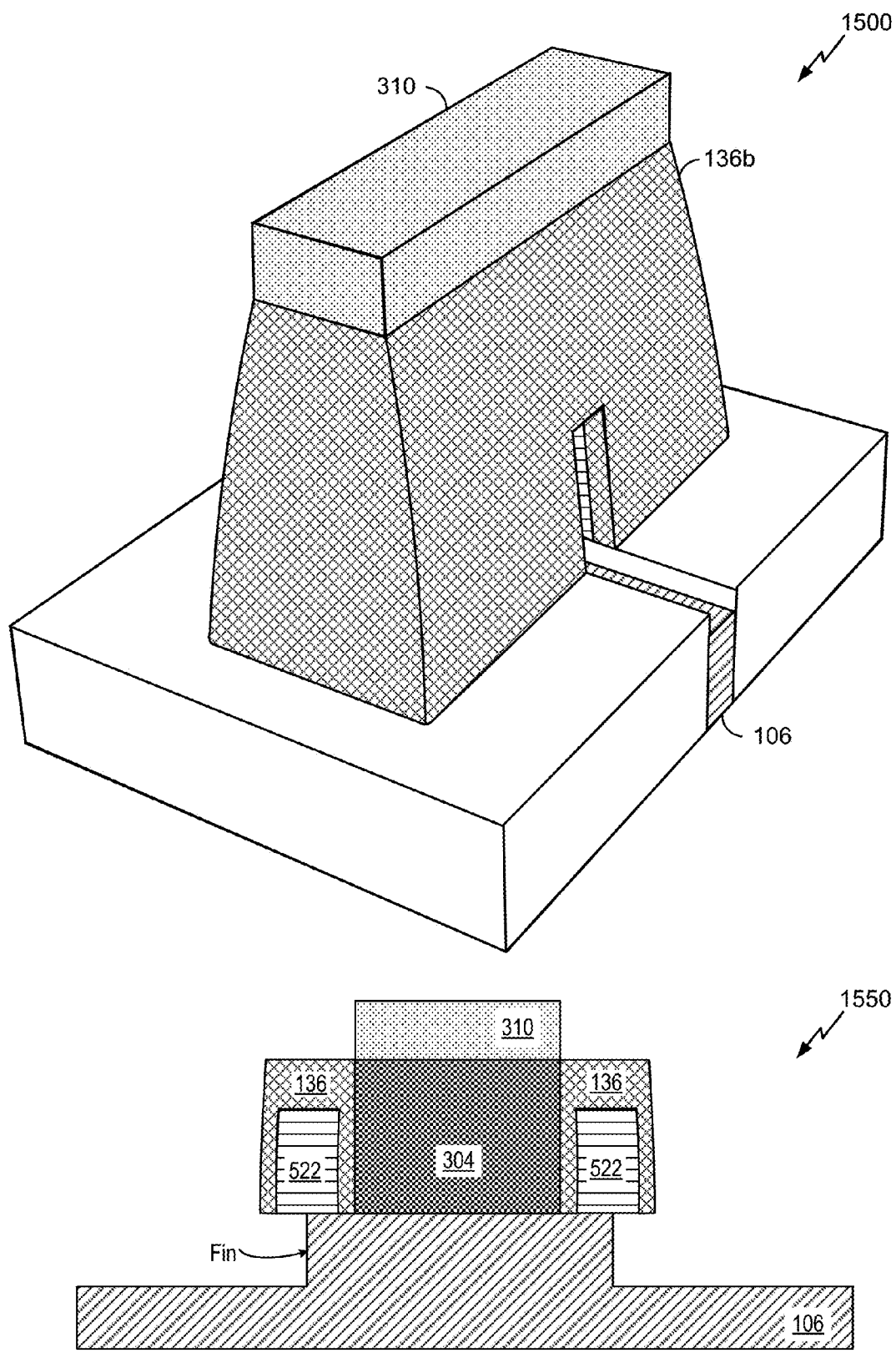
FIG. 15 is a first illustrative diagram of at least one stage of the second process of fabricating a semiconductor device after removing a portion of a fin of the semiconductor device.

Referring to FIG. 15, a first illustrative diagram of at least one stage of a second process of fabricating a semiconductor device after removing a portion of a fin of the semiconductor device is depicted and generally designated 1500. FIG. 15 also illustrates a cross section 1550 through a fin of the semiconductor device. A portion of the substrate 106 (e.g., a portion of the fin) associated with a source/drain (S/D) region may be removed. For example, the portion of the substrate 106 may be etched (e.g., recessed) that is associated with one or more S/D regions while another portion of the fin associated with a channel region is not removed. After the portion of the substrate 106 is etched, a portion of a second spacer structure 136b and a portion of a sacrificial spacer 522 may be exposed. The semiconductor device of FIG. 15 may include or correspond to the semiconductor device as illustrated in FIG. 7. For example, the diagram 1500 of at least one stage of the second process may be preceded by one or more stages, such as one or more stages of a process as illustrated with reference to FIGS. 2-6.

Figure 16:
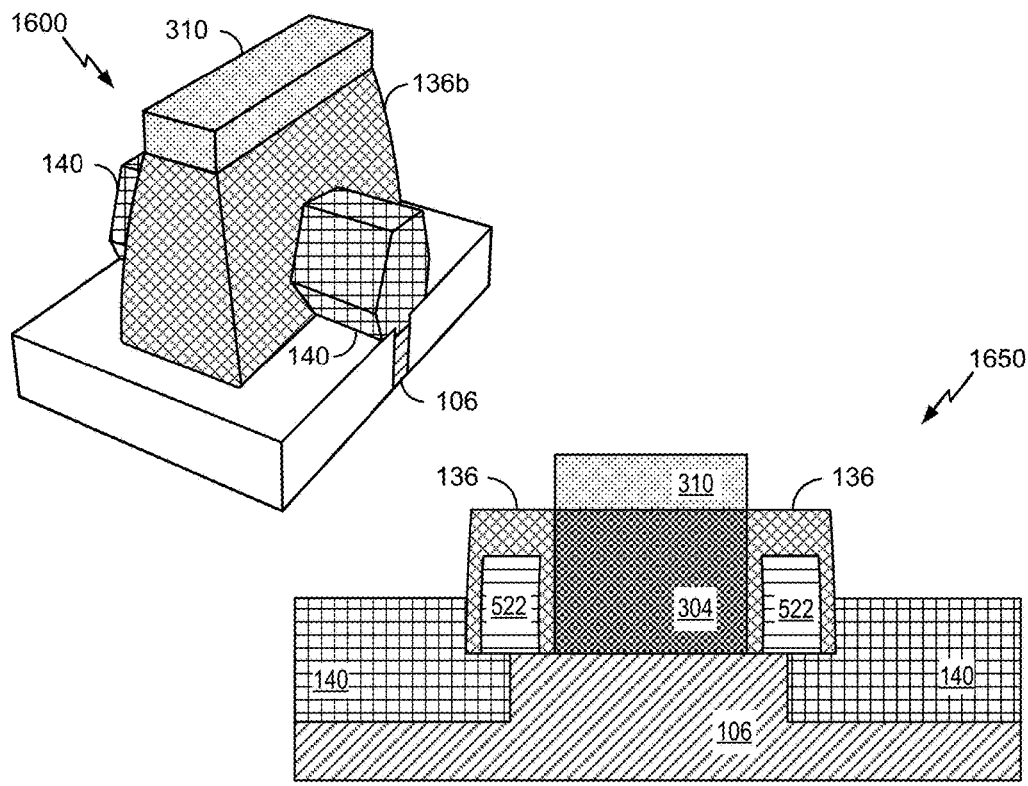
FIG. 16 is a second illustrative diagram of at least one stage of the second process of fabricating a semiconductor device after forming a source/drain region.

Referring to FIG. 16, a second illustrative diagram of at least one stage of the second process of fabricating the semiconductor device after forming a source/drain region is performed is depicted and generally designated 1600. FIG. 16 also illustrates a cross section 1650 through the fin of the semiconductor device. A source/drain (SD) region 140 may be formed (e.g., raised) above a recessed portion of the substrate 106 and/or above the wafer 202. For example, the source/drain (SD) region 140 may be epitaxially deposited (e.g., epitaxially grown) on the portion of the substrate 106. The S/D region 140 may be in contact with the sacrificial spacer 522 and/or the spacer 136 (e.g., a second spacer structure 136b).

Figure 17:
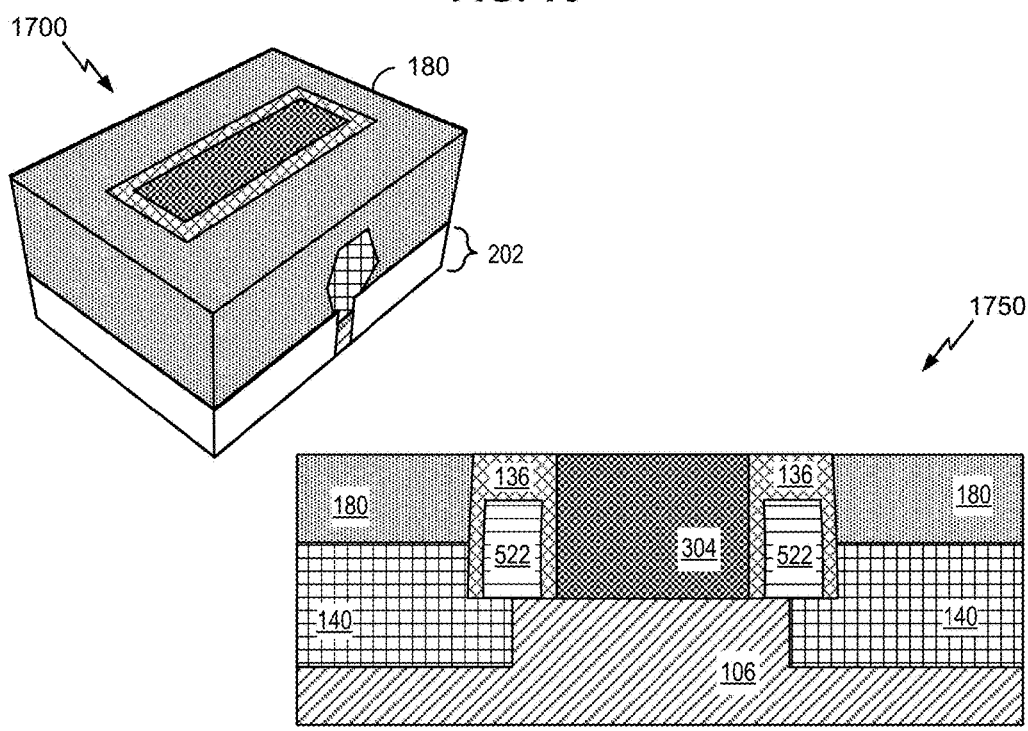
FIG. 17 is a third illustrative diagram of at least one stage of the second process of fabricating the semiconductor device after a dielectric material is deposited and after planarization is performed.

Referring to FIG. 17, a third illustrative diagram of at least one stage of the second process of fabricating the semiconductor device after a dielectric material is deposited and after planarization is performed is depicted and generally designated 1700. FIG. 17 also illustrates a cross section 1750 through the fin of the semiconductor device. A dielectric material 180 may be deposited above the wafer 202. For example, the dielectric material 180 may include a silicon-containing material. After the dielectric material 180 is deposited, a chemical mechanical planarization (CMP) (e.g., a chemical mechanical polish) may be performed to remove a portion of the dielectric material 180 and the hardmask 310. By removing the hardmask 310, the CMP may expose the dummy gate 304, such as a surface of the dummy gate 304. Additionally or alternatively, the CMP may expose a surface of the spacer 136 (e.g., a first spacer structure 136a and/or a second spacer structure 136b).

Figure 18:
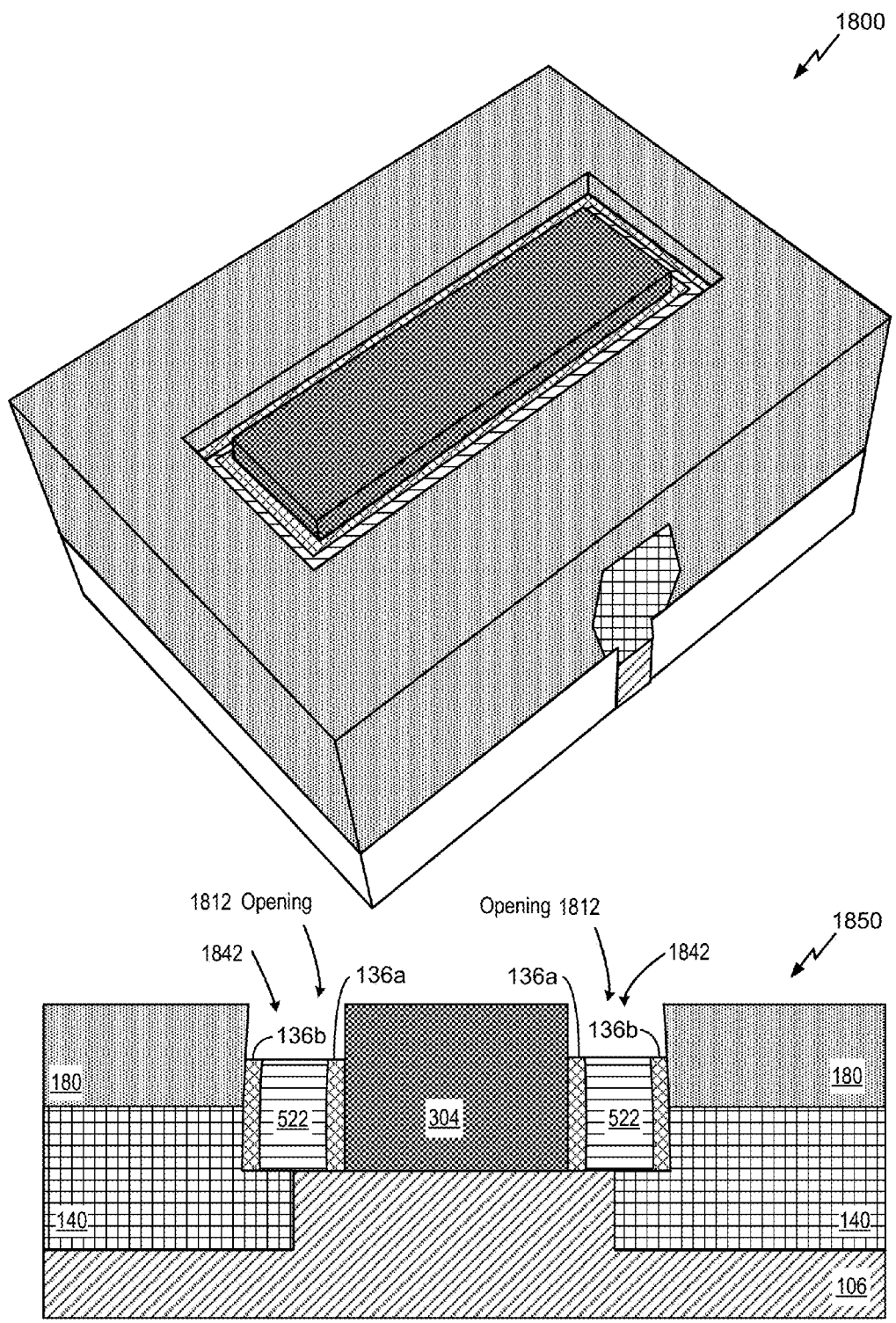
FIG. 18 is a fourth illustrative diagram of at least one stage of the second process of fabricating the semiconductor device after exposing a portion of a sacrificial spacer.

Referring to FIG. 18, a fourth illustrative diagram of at least one stage of the second process of fabricating the semiconductor after exposing a portion of the sacrificial spacer is depicted and generally designated 1800. FIG. 18 also illustrates a cross section 1850 through the fin of the semiconductor device. A portion of the spacer 136 (including the first spacer structure 136a and/or the second spacer structure 136b) may be removed to expose a portion of the sacrificial spacer 522. For example, the portion of the spacer 136 may be etched to expose a surface of the sacrificial spacer 522. Removing the portion of the spacer 136 may create a cavity 1842. The cavity 1842 may be defined by the dummy gate 304, the first spacer structure 136a, the sacrificial spacer 522, the second spacer structure 136b, the dielectric material 180, or a combination thereof. After the portion of the spacer 136 is removed to expose the sacrificial spacer 522, a portion of the first spacer structure 136a that is positioned between the sacrificial spacer 522 and the dummy gate 304 may be exposed. Additionally, after the portion of the spacer 136 is removed to expose the sacrificial spacer 522, a portion of the second spacer structure 136b that is positioned between the sacrificial spacer 522 and the dielectric material 180 may be exposed. The cavity 1842 may have an opening 1812 through which the sacrificial spacer 522 may be removed.

Figure 19:
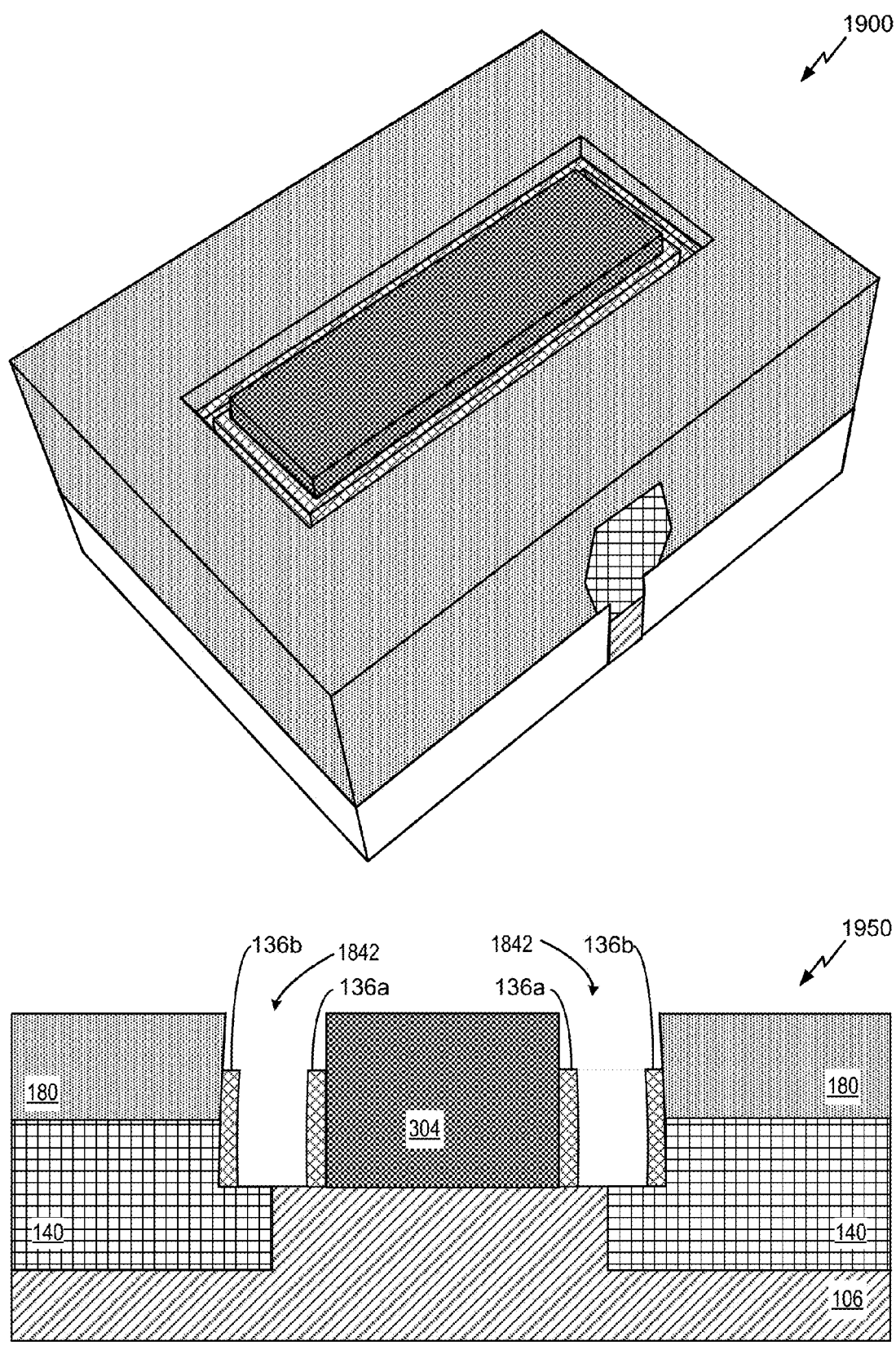
FIG. 19 is a fifth illustrative diagram of at least one stage of the second process of fabricating the semiconductor device after removing a sacrificial spacer.

Referring to FIG. 19, a fifth illustrative diagram of at least one stage of the second process of fabricating the semiconductor device after removing a sacrificial spacer is depicted and generally designated 1900. FIG. 19 also illustrates a cross section 1950 through the fin of the semiconductor device. The sacrificial spacer 522 may be removed using a chemical or reactive gas chemistry. For example, a hydrogen reaction or a standard clean 1 type may be used to remove the sacrificial spacer 522 without performing an etch operation. The sacrificial spacer 522 may be removed through the opening 1812 of FIG. 18. Removal of the sacrificial spacer 552 may not affect (e.g., may not remove) the first spacer structure 136a or the second spacer structure 136b. Removal of the sacrificial spacer 522 may extend the cavity 1842 such that the cavity 1842 is defined by the substrate 106 (e.g., the fin) and/or the S/D region 140.

Figure 20:
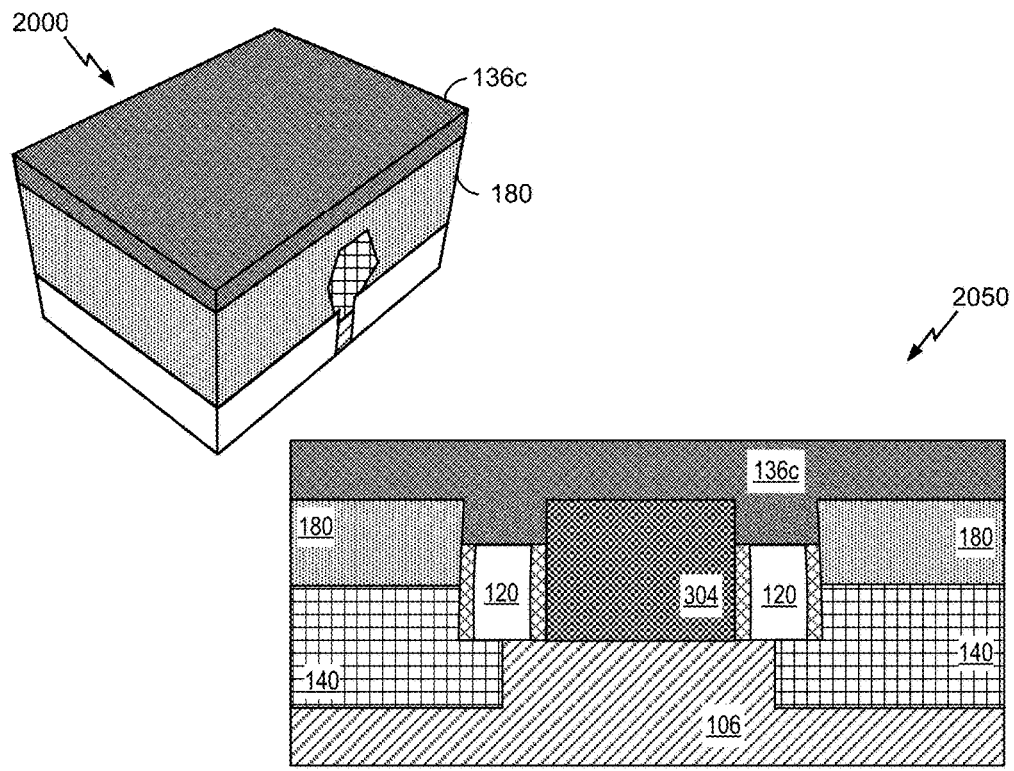
FIG. 20 is a sixth illustrative diagram of at least one stage of the second process of fabricating the semiconductor device after forming a third spacer material.

Referring to FIG. 20, a sixth illustrative diagram of at least one stage of the second process of fabricating the semiconductor device after forming a third spacer material is depicted and generally designated 2000. FIG. 20 also includes a cross section 2050 through the fin of the semiconductor device. A third spacer structure 136c may be formed on the semiconductor device. For example, the third spacer structure 136c may be non-conformally deposited on the semiconductor device. The third spacer structure 136c may extend at least part way into the cavity 1842 of FIG. 19 and may block (e.g., close) the opening 1812 through which the sacrificial spacer 522 was removed. By closing the opening 1812 through which the sacrificial spacer 522 was removed, a gap 120 (e.g., an air-gap or a vacuum gap) may be defined by at least a portion of the third spacer structure 136c, the first spacer structure 136a, and/or the second spacer structure 136b. The gap 120 may further be defined by the wafer 202, the substrate 106, and/or the S/D region 140. Additionally or alternatively, the gap 120 may further be defined by the fin.

The third spacer structure 136c may include a third spacer material, such as silicon nitride or another nitride, such as a nitride that includes carbon (C) or boron (B), as illustrative, non-limiting examples. The third spacer material may be the same material or a different material than the first spacer material of the first spacer structure 136a and/or the second spacer material of the second spacer structure 136b. The third spacer structure 136c may be configured to operate as a cap or a seal to establish and define the gap 120.

Figure 21:
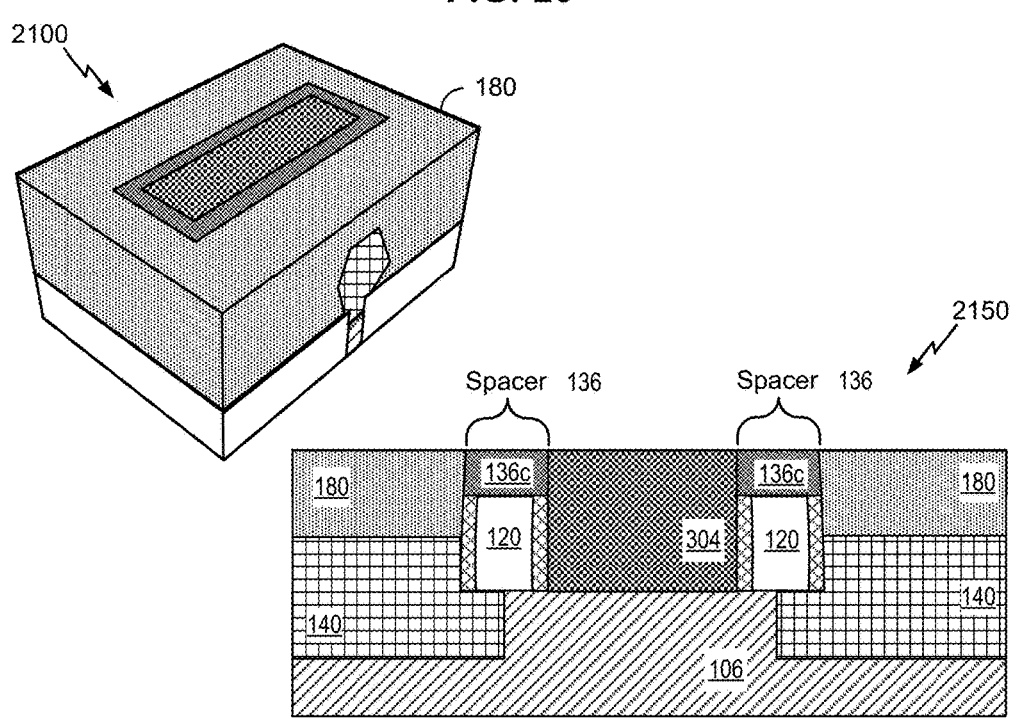
FIG. 21 is a seventh illustrative diagram of at least one stage of the second process of fabricating the semiconductor device after planarization is performed.

Referring to FIG. 21, a seventh illustrative diagram of at least one stage of the second process of fabricating the semiconductor device after planarization is performed is depicted and generally designated 2100. FIG. 21 also illustrates a cross section 2150 through the fin of the semiconductor device. A chemical mechanical planarization (CMP) (e.g., a chemical mechanical polish) may be performed to remove a portion of the third spacer structure 136c and thus establish the spacer 136 which includes the first spacer structure 136a, the second spacer structure 136b, and the third spacer structure 136c. By removing the portion of the third spacer structure 136c, the CMP may expose the dummy gate 304, such as a surface of the dummy gate 304. Additionally or alternatively, by removing the portion of the third spacer structure 136c, the CMP may expose a surface of the dielectric material.

Figure 22:
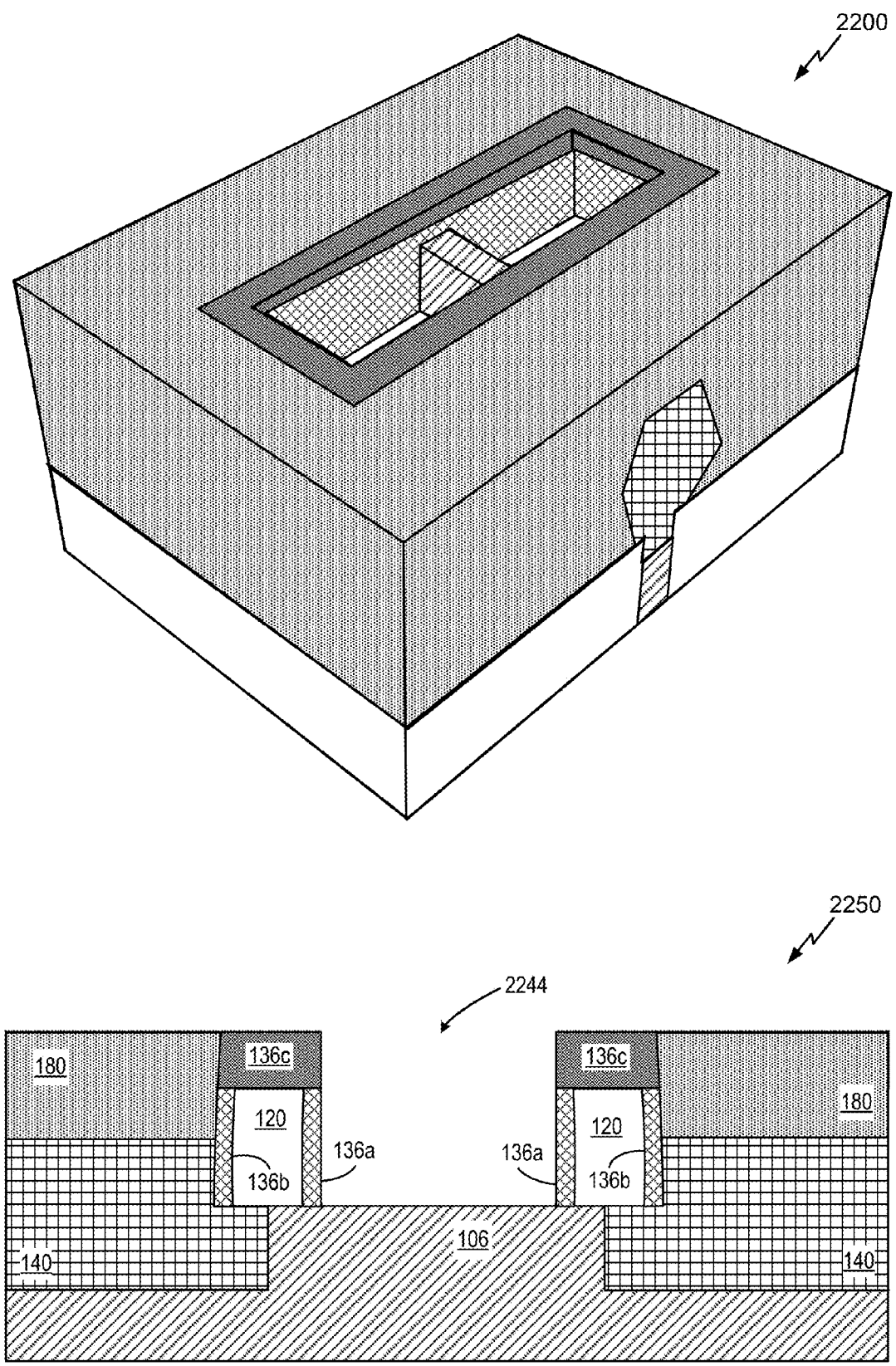
FIG. 22 is an eighth illustrative diagram of at least one stage of the second process of fabricating the semiconductor device after a dummy gate is removed.

Referring to FIG. 22, an eighth illustrative diagram of at least one stage of the second process of fabricating the semiconductor device after a dummy gate is removed is depicted and generally designated 2200. FIG. 22 also illustrates a cross section 2250 through the fin of the semiconductor device. The dummy gate 304 may be removed to establish a cavity 2244. For example, the dummy gate 304 may be etched out to expose at least a portion of the substrate 106 (e.g., the fin) associated with a channel region. The dummy gate 304 may be removed using a dry etch, a wet etch, or a combination thereof.

Figure 23:
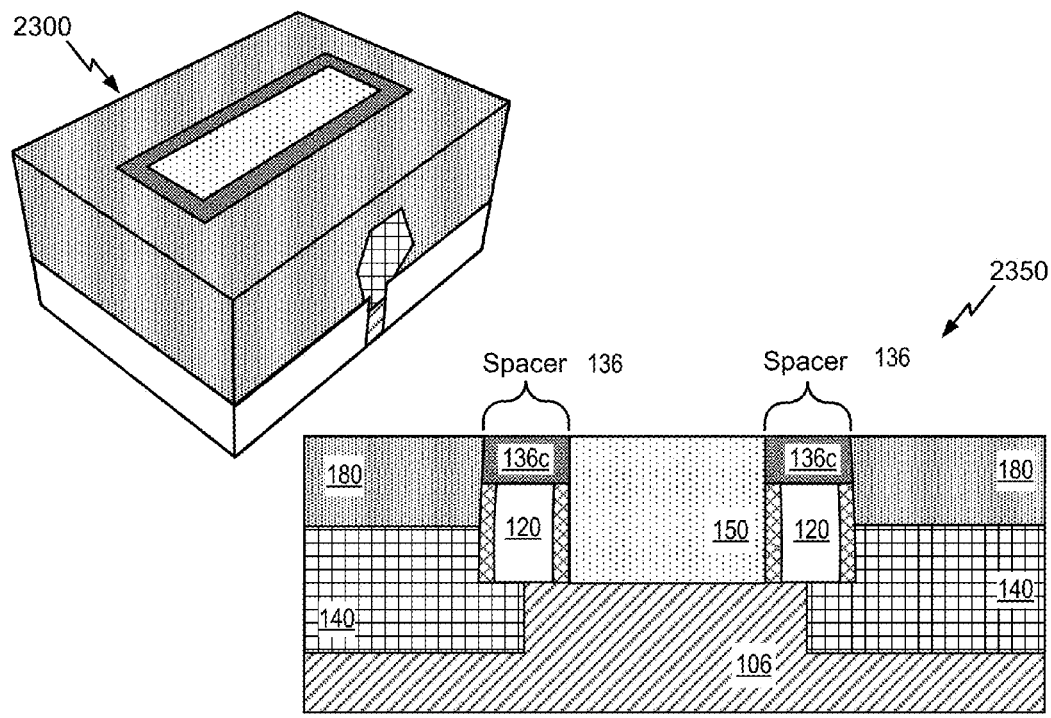
FIG. 23 is a ninth illustrative diagram of at least one stage of the second process of fabricating the semiconductor device after forming a gate.

Referring to FIG. 23, a ninth illustrative diagram of at least one stage of the second process of fabricating the semiconductor device after forming a gate is depicted and generally designated 2300. FIG. 23 also illustrates a cross section 2350 through the fin of the semiconductor device. A gate 150 may be formed (e.g., deposited) in the cavity 2244 of FIG. 22. For example, the gate 150 may be formed on (e.g., over) a portion of the substrate 106 (e.g., the fin) that is exposed in the cavity 2244 of FIG. 22. The gate 150 may include a high-k material. The gate 150 may include one or more layers (e.g., one or more materials), such as an oxide layer, a high-k gate dielectric, and/or a metal gate layer (e.g., a metal gate material), as illustrative, non-limiting embodiments.

Figure 24:
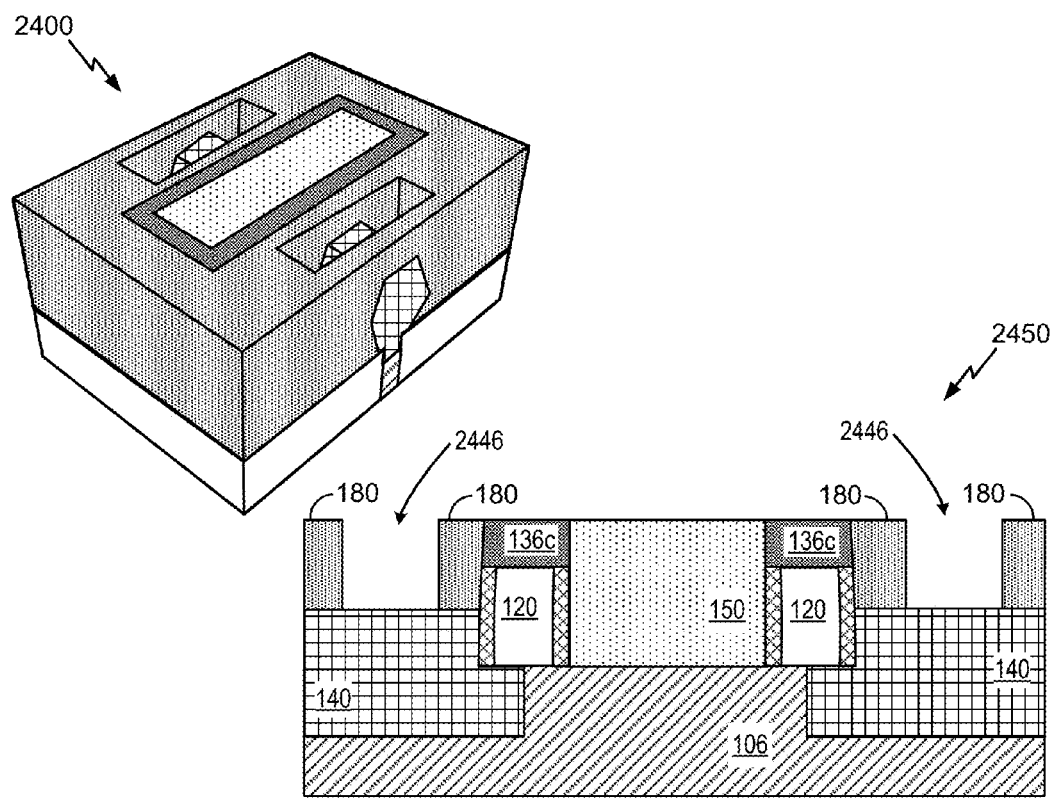
FIG. 24 is a tenth illustrative diagram of at least one stage of the second process of fabricating the semiconductor device after forming a cavity.

Referring to FIG. 24, a tenth illustrative diagram of at least one stage of the second process of fabricating the semiconductor device after forming a cavity is depicted and generally designated 2400. FIG. 24 also illustrates a cross section 2450 through the fin of the semiconductor device. Contact patterning may be performed to create a cavity 2446. For example, an etch process may be used to create the cavity 2446 (e.g., a trench) and to expose a portion (e.g. a surface) of the S/D region 140. In a particular embodiment, the cavity 2446 does not expose a portion of the spacer 136, such as a surface of the second spacer structure 136b or the third spacer structure 136c.

Figure 25:
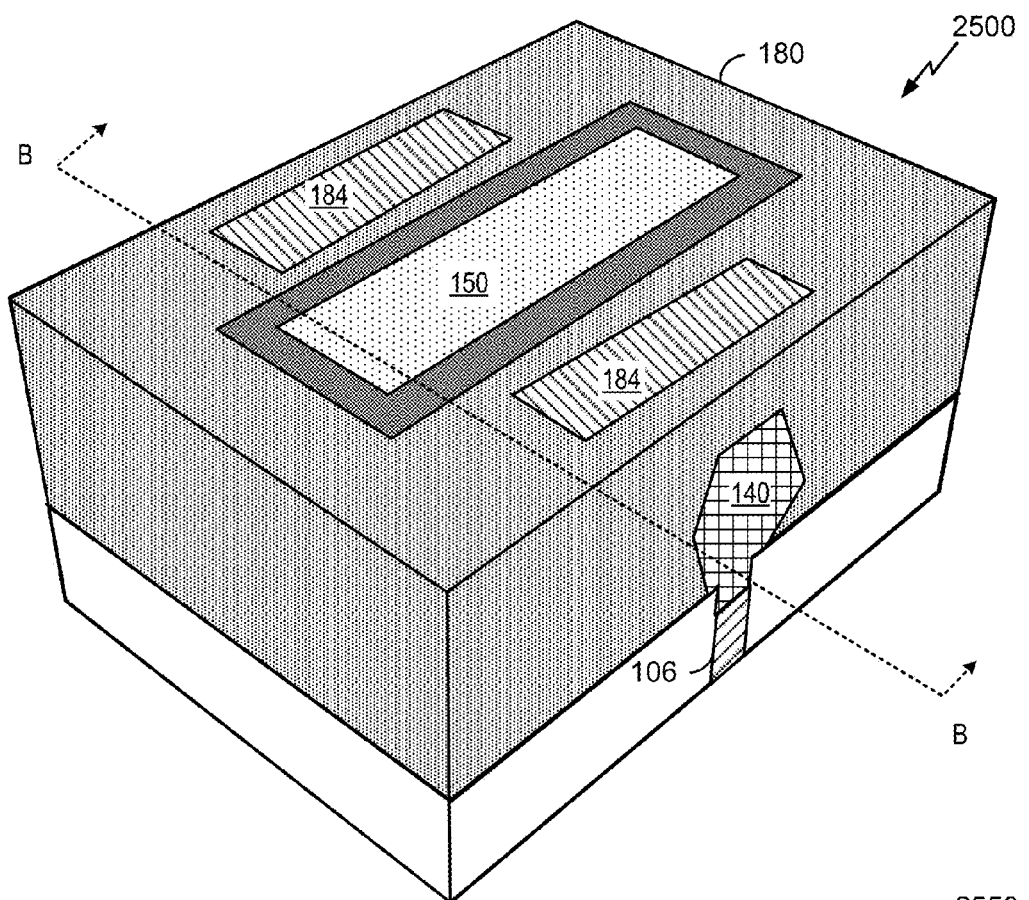
FIG. 25 is an eleventh illustrative diagram of at least one stage of the second process of fabricating the semiconductor device after forming a contact.
Figure 25:
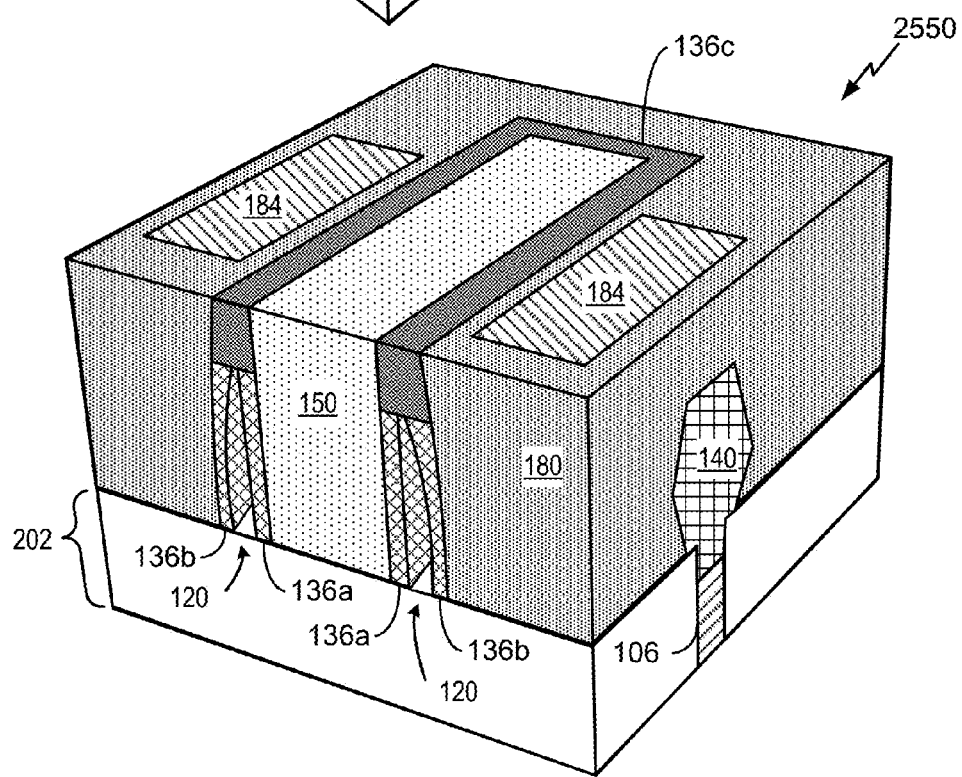

Referring to FIG. 25, an eleventh illustrative diagram of at least one stage of the second process of fabricating the semiconductor device after forming a contact is depicted and generally designated 2500. FIG. 25 also illustrates a cross section 2550 through a line B-B of the semiconductor device. A contact 184 may be formed in the cavity 2446 of FIG. 24. The contact 184 may not touch the spacer 136. The contact 184 may be a metal material. The semiconductor device of FIG. 25 may include or correspond to the semiconductor device 160 of FIG. 1B.

The semiconductor device may advantageously include the spacer 136 that defines the gap 120. The gap 120 may reduce a parasitic capacitance (e.g., a gate capacitance, such as a capacitance between the gate 150 and the contact 184).

Additionally, the gap 120 may provide an AC performance improvement as compared to FinFET devices that do not have a defined gap.

Figure 26:
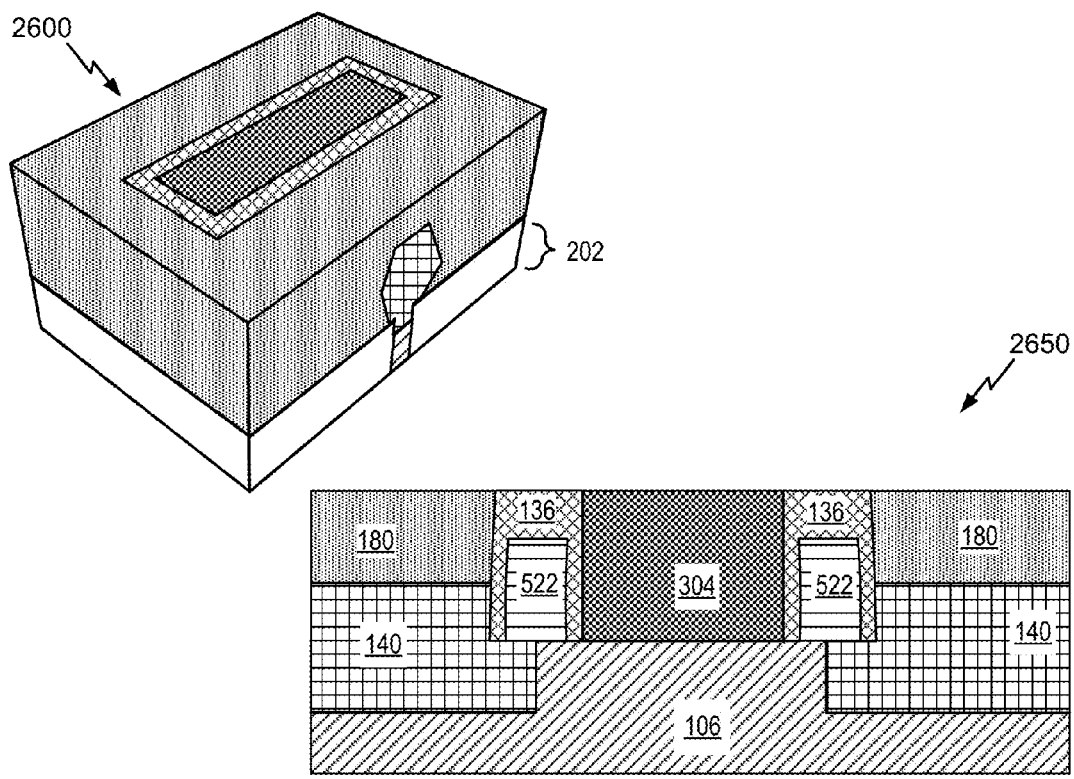
FIG. 26 is a first illustrative diagram of at least one stage of a third process of fabricating a semiconductor device that includes a source/drain region that defines a gap.

Referring to FIG. 26, a first illustrative diagram of at least one stage of a third process of fabricating a semiconductor device after a dielectric material is deposited and after planarization is performed is depicted and generally designated 2600. FIG. 26 also illustrates a cross section 2650 through a fin of the semiconductor device. A dielectric material 180 may be deposited above the wafer 202. For example, the dielectric material 180 may include a silicon-containing material. After the dielectric material 180 is deposited, a chemical mechanical planarization (CMP) (e.g., a chemical mechanical polish) may be performed to remove a portion of the dielectric material 180 and the hardmask 310. By removing the hardmask 310, the CMP may expose the dummy gate 304, such as a surface of the dummy gate 304. Additionally or alternatively, the CMP may expose a surface of the spacer 136 (e.g., a first spacer structure 136a and/or a second spacer structure 136b).

Figure 27:
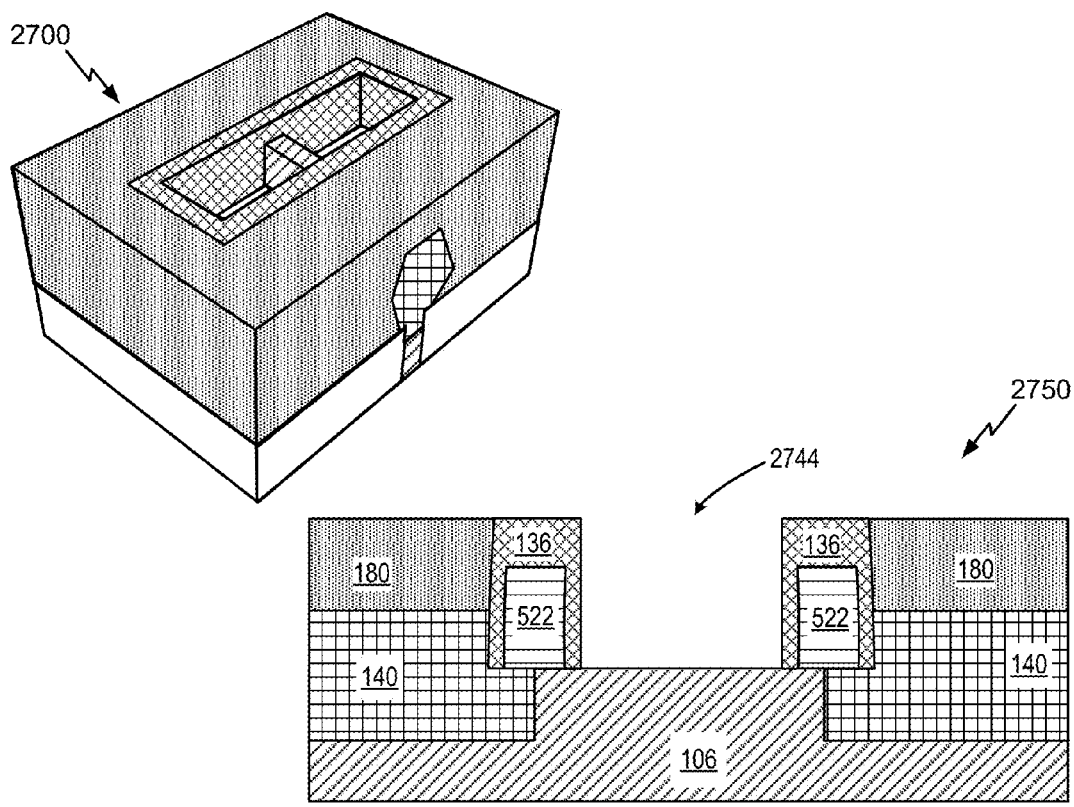
FIG. 27 is a second illustrative diagram of at least one stage of the third process of fabricating the semiconductor device after a dummy gate is removed.

Referring to FIG. 27, a second illustrative diagram of at least one stage of the third process of fabricating the semiconductor device after a dummy gate is removed is depicted and generally designated 2700. FIG. 27 also illustrates a cross section 2750 through the fin of the semiconductor device. The dummy gate 304 may be removed to establish a cavity 2744. For example, the dummy gate 304 may be etched out to expose at least a portion of the substrate 106 (e.g., the fin) associated with a channel region. The dummy gate 304 may be removed using a dry etch, a wet etch, or a combination thereof.

Figure 28:
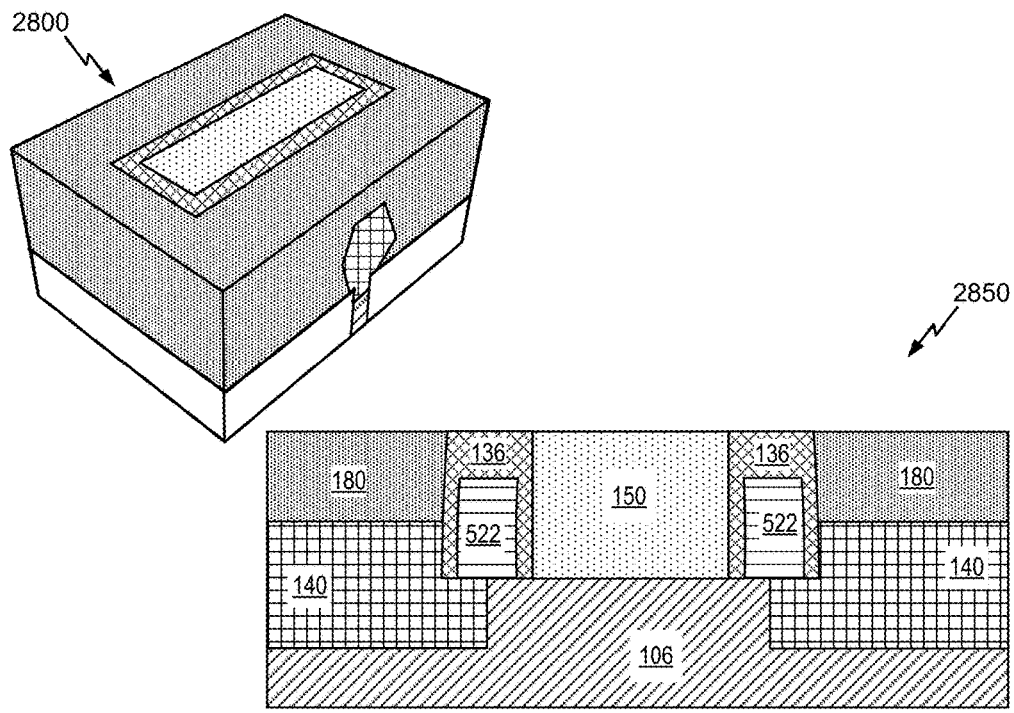
FIG. 28 is a third illustrative diagram of at least one stage of the third process of fabricating the semiconductor device after forming a gate.

Referring to FIG. 28, a third illustrative diagram of at least one stage of the third process of fabricating the semiconductor device after forming a gate is depicted and generally designated 2800. FIG. 28 also illustrates a cross section 2850 through the fin of the semiconductor device. A gate 150 may be formed (e.g., deposited) in the cavity 2744 of FIG. 27. For example, the gate 150 may be formed on (e.g., over) a portion of the substrate 106 (e.g., the fin) that is exposed in the cavity 2744 of FIG. 27. The gate 150 may include a high-k material. The gate 150 may include one or more layers (e.g., one or more materials), such as an oxide layer, a high-k gate dielectric, and/or a metal gate layer (e.g., a metal gate material), as illustrative, non-limiting embodiments.

Figure 29:
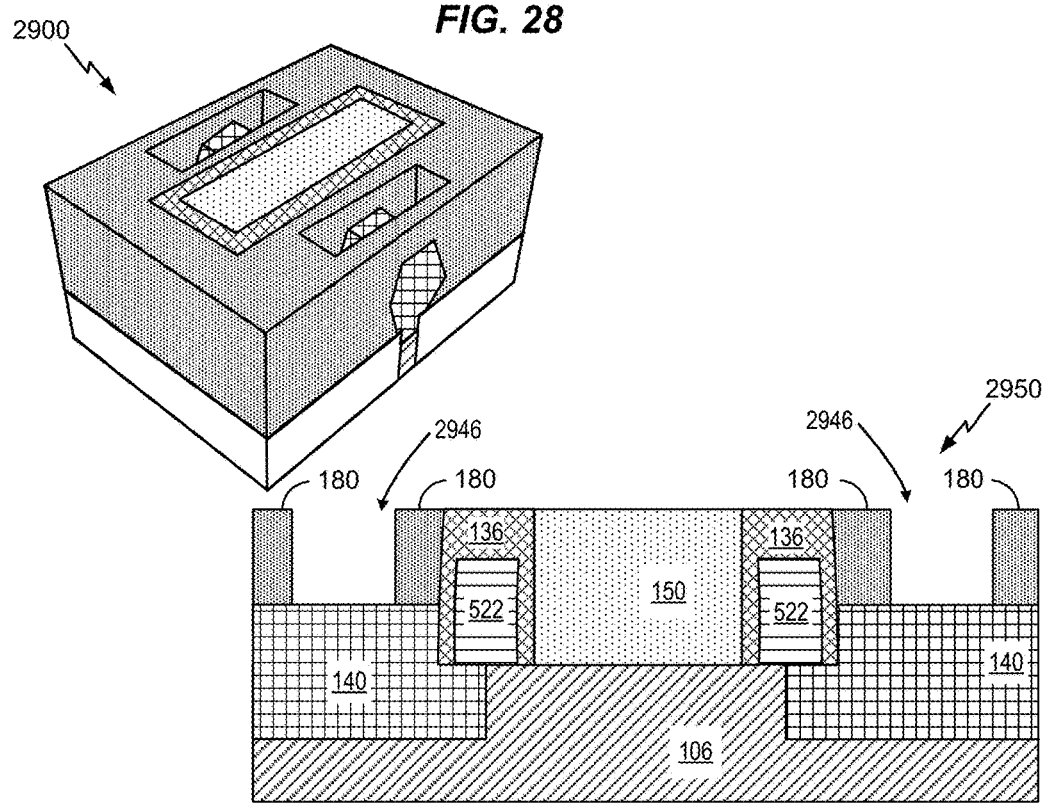
FIG. 29 is a fourth illustrative diagram of at least one stage of the third process of fabricating the semiconductor device after forming a cavity.

Referring to FIG. 29, a third illustrative diagram of at least one stage of the third process of fabricating the semiconductor after forming a cavity is depicted and generally designated 2900. FIG. 29 also illustrates a cross section 2950 through the fin of the semiconductor device. Contact patterning may be performed to create a cavity 2946. For example, an etch process may be used to create the cavity 2946 (e.g., a trench) and to expose a portion (e.g. a surface) of the S/D region 140. In a particular embodiment, the cavity 2946 does not expose a portion of the spacer 136, such as a surface of the second spacer structure 136b.

Figure 30:
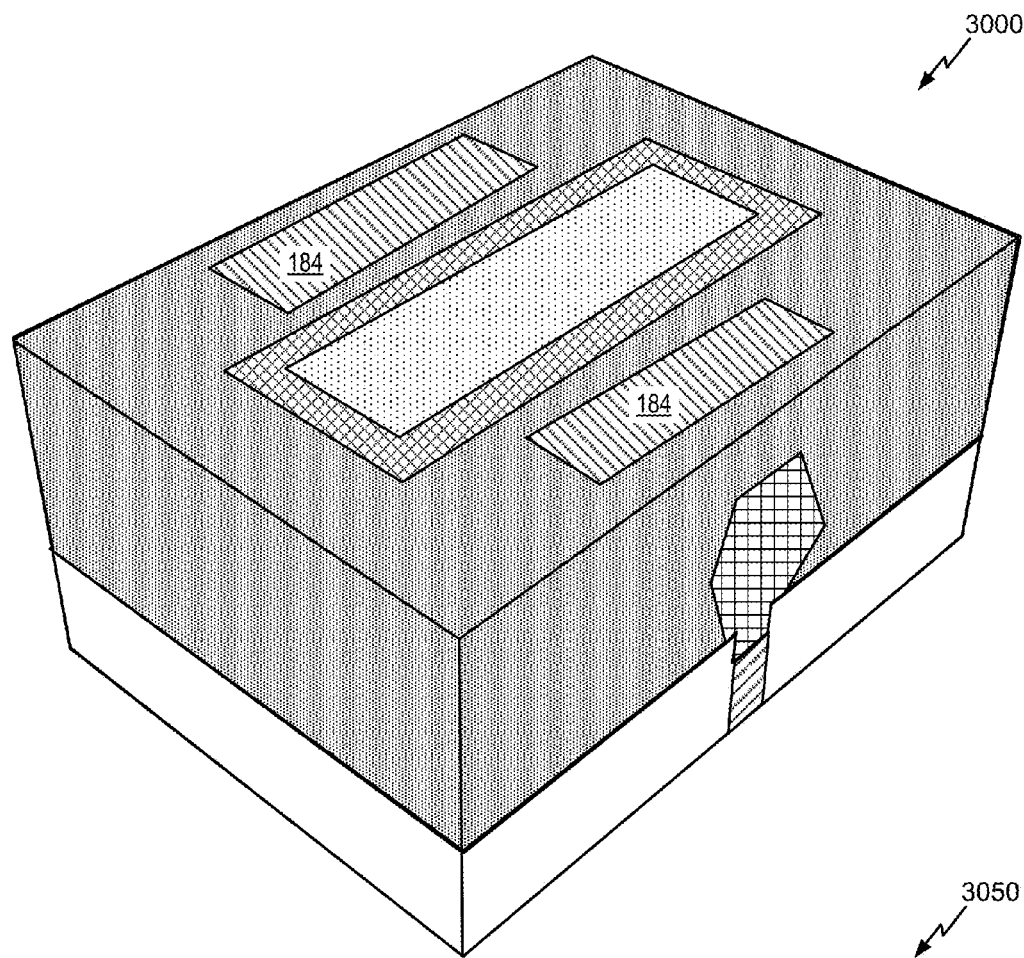
FIG. 30 is a fifth illustrative diagram of at least one stage of the third process of fabricating the semiconductor device after forming a contact.
Figure 30:
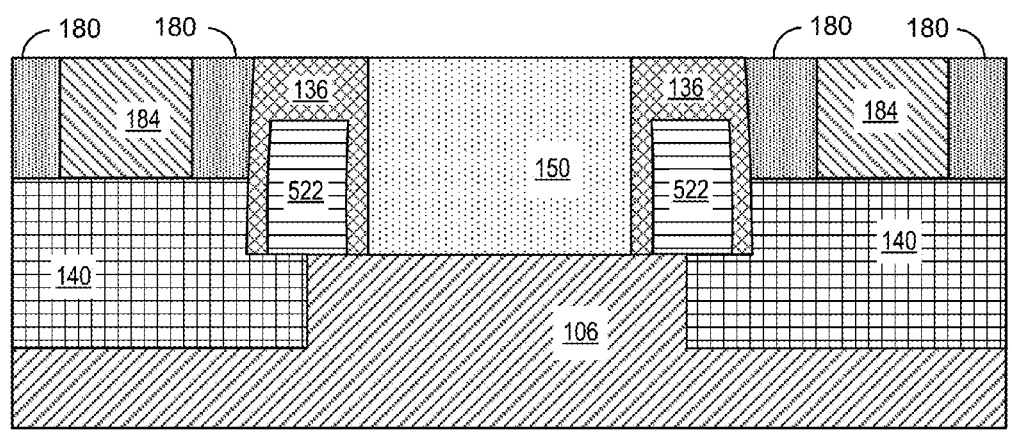

Referring to FIG. 30, a fifth illustrative diagram of at least one stage of the third process of fabricating the semiconductor device forming a contact is depicted and generally designated 3000. FIG. 30 also illustrates a cross section 3050 through the fin of the semiconductor device. A contact 184 may be formed in the cavity 2946 of FIG. 29. In a particular embodiment, the contact 184 does not touch the spacer 136. The contact 184 may be a metal material.

Figure 31:
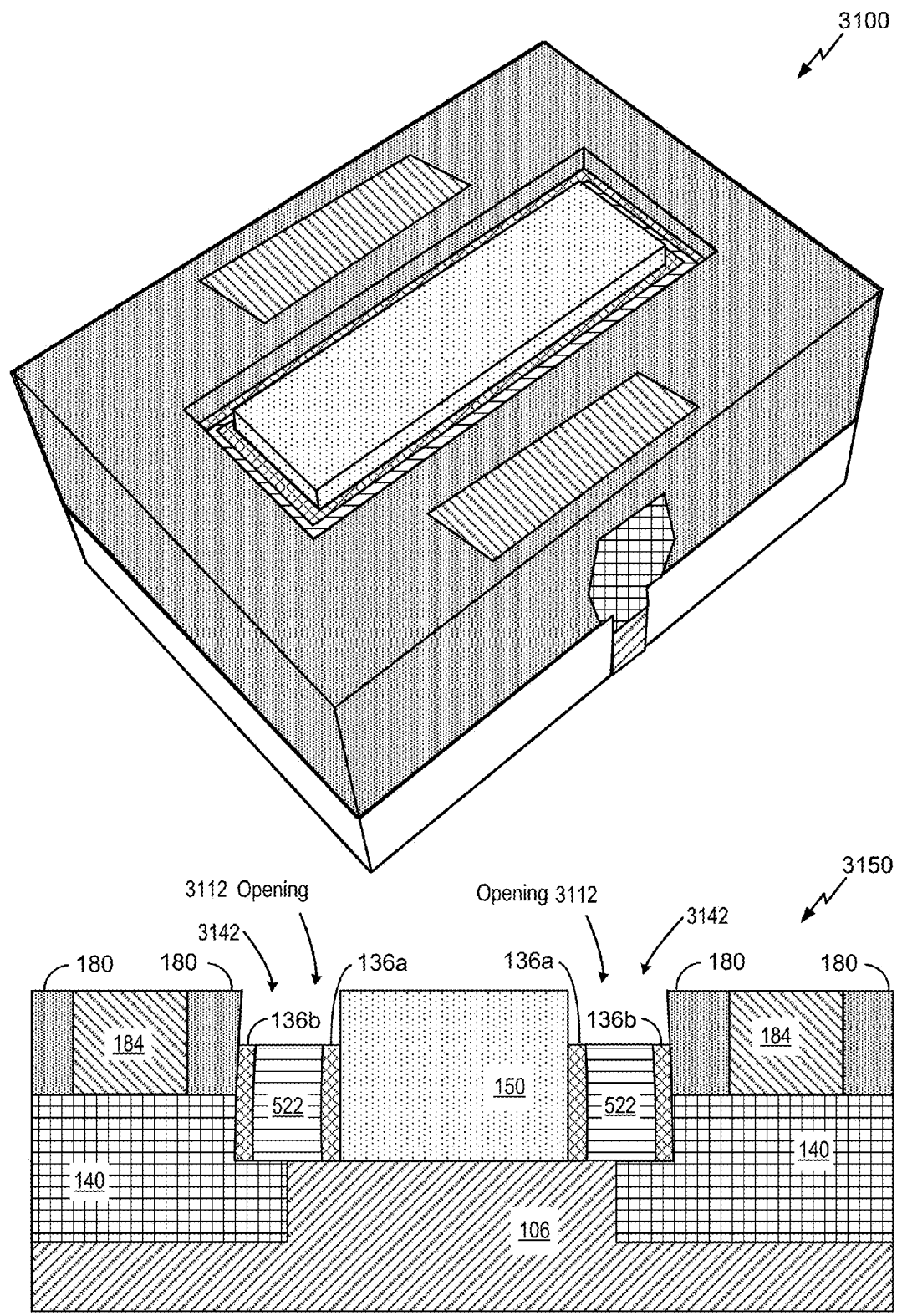
FIG. 31 is a sixth illustrative diagram of at least one stage of the third process of fabricating the semiconductor device after exposing a portion of a sacrificial spacer.

Referring to FIG. 31, a sixth illustrative diagram of at least one stage of the third process of fabricating the semiconductor device after exposing a portion of the sacrificial spacer is depicted and generally designated 3100. FIG. 31 also includes a cross section 3150 through the fin of the semiconductor device. A portion of the spacer 136 (including the first spacer structure 136a and the second spacer structure 136b) may be removed to expose a portion of the sacrificial spacer 522. For example, the portion of the spacer 136 may be etched to expose a surface of the sacrificial spacer 522. Removing the portion of the spacer 136 may create a cavity 3142. The cavity 1842 may be defined by the gate 150, the first spacer structure 136a, the sacrificial spacer 522, the second spacer structure 136b, the dielectric material 180, or a combination thereof. After the portion of the spacer 136 is removed to expose the sacrificial spacer 522, a portion of the first spacer structure 136a that is positioned between the sacrificial spacer 522 and the gate 150 may be exposed. Additionally, after the portion of the spacer 136 is removed to expose the sacrificial spacer 522, a portion of the second spacer structure 136b that is positioned between the sacrificial spacer 522 and the dielectric material 180 may be exposed. The cavity 3142 may be associated with an opening 3112 through which the sacrificial spacer 522 may be removed.

Figure 32:
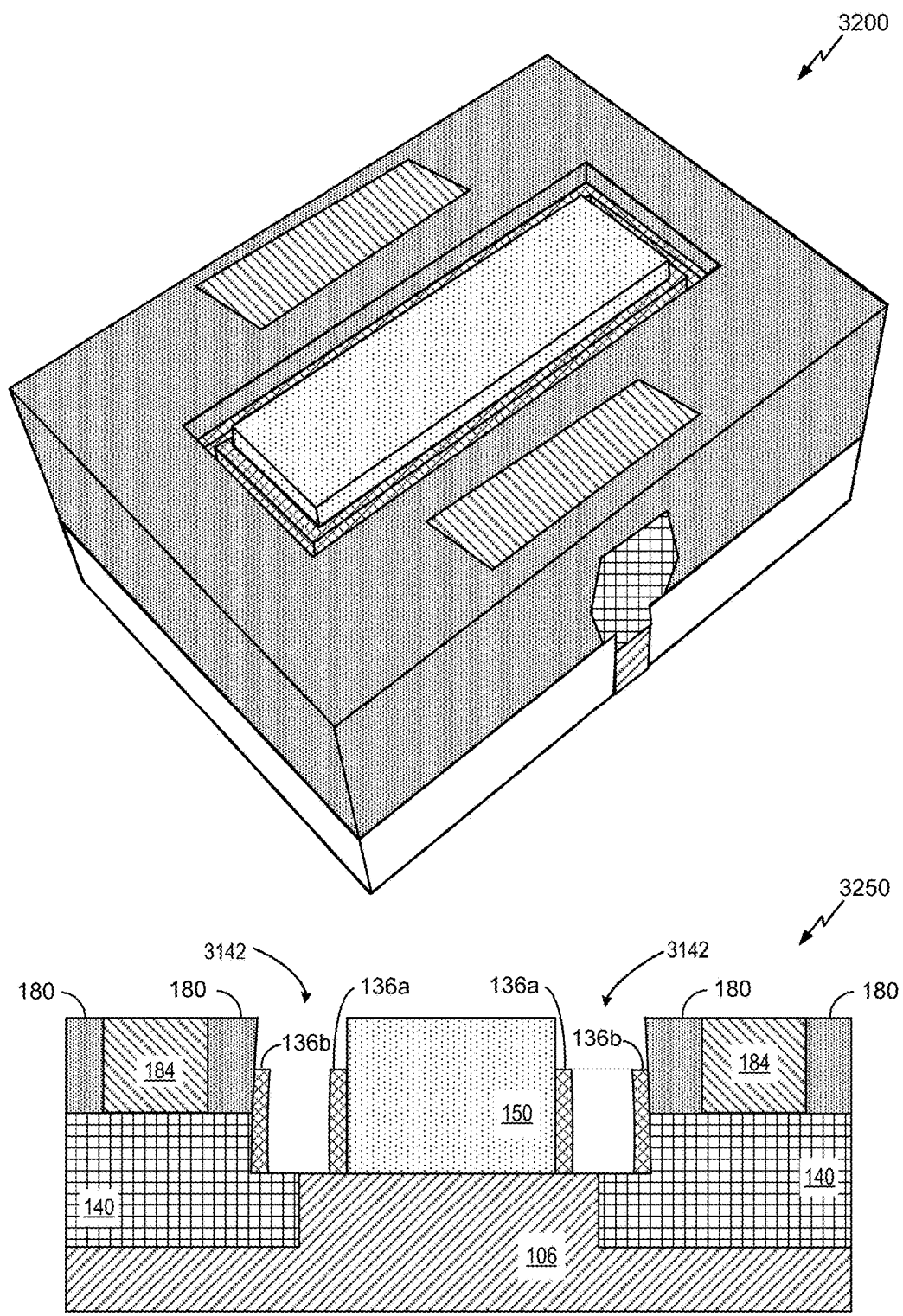
FIG. 32 is a seventh illustrative diagram of at least one stage of the third process of fabricating the semiconductor device after removing the sacrificial spacer.

Referring to FIG. 32, a seventh illustrative diagram of at least one stage of the third process of fabricating the semiconductor device after removing a sacrificial spacer is depicted and generally designated 3200. FIG. 32 also illustrates a cross section 3250 through the fin of the semiconductor device. The sacrificial spacer 522 may be removed using a chemical or reactive gas chemistry. For example, a hydrogen reaction or a standard clean 1 type may be used to remove the sacrificial spacer 522 without performing an etch operation. Removal of the sacrificial spacer 552 may not affect (e.g., remove) the first spacer structure 136a or the second spacer structure 136b. Removal of the sacrificial spacer 522 may extend the cavity 3142 such that the cavity 3142 is defined by the substrate 106 (e.g., the fin) and/or the S/D region 140.

Figure 33:
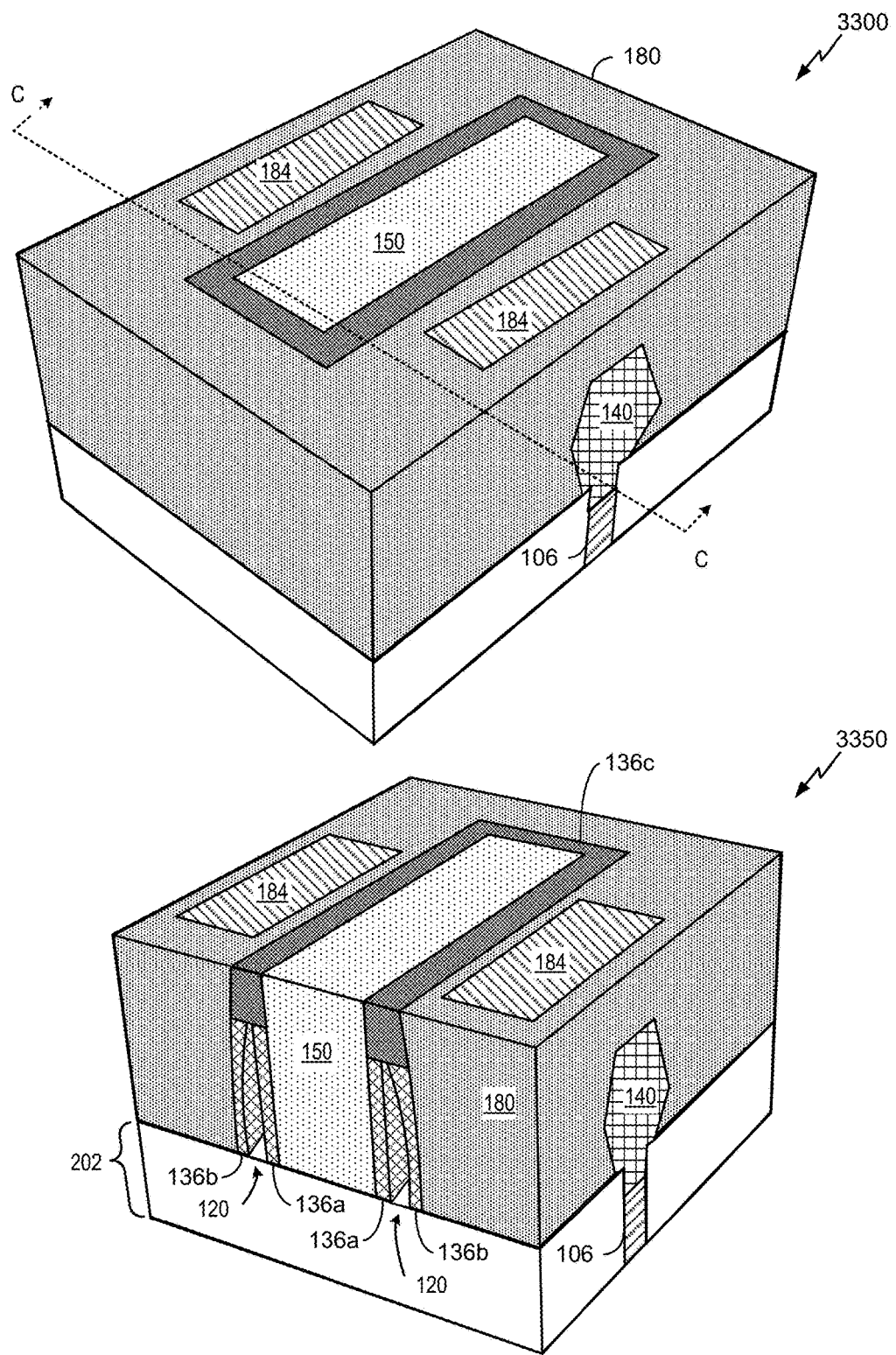
FIG. 33 is an eighth illustrative diagram of at least one stage of the first process of fabricating the semiconductor device after forming a third spacer material and after planarization is performed.

Referring to FIG. 33, an eighth illustrative diagram of at least one stage of the third process of fabricating the semiconductor device after forming a third spacer material and after planarization is performed is depicted and generally designated 3300. FIG. 33 also illustrates a cross section 3350 through a line C-C of the semiconductor device. A third spacer structure 136c may be formed on the semiconductor device. For example, the third spacer structure 136c may be non-conformally deposited on the semiconductor device. The third spacer structure 136c may extend at least part way into the cavity 3142 of FIG. 32 and may block (e.g., close) the opening 3112 through which the sacrificial spacer 522 was removed. By closing the opening 3112, a gap 120 (e.g., an air-gap or a vacuum gap) may be defined by the third spacer structure 136c, the first spacer structure 136a, and/or the second spacer structure 136b. The gap 120 may further be defined by the wafer 202, the substrate 106), and/or the S/D region 140. Additionally or alternatively, the gap 120 may further be defined by the fin.

In a particular embodiment, the third spacer structure 136c includes silicon nitride or another nitride, such as a nitride that includes carbon or boron. The third spacer structure 136c may be the same material or a different material than the first spacer structure 136a and/or the second spacer structure 136b. The third spacer structure 136c may be configured to operate as a cap or a seal to establish and define the gap 120. The semiconductor device of FIG. 32 may include or correspond to the semiconductor device 160 of FIG. 1B.

The semiconductor device may advantageously include the spacer 136 that defines the gap 120. The gap 120 may reduce a parasitic capacitance (e.g., a gate capacitance, such as a capacitance between the gate 150 and the contact 184). Additionally, the gap 120 may provide an AC performance improvement as compared to FinFET devices that do not have a defined gap.

Figure 34:
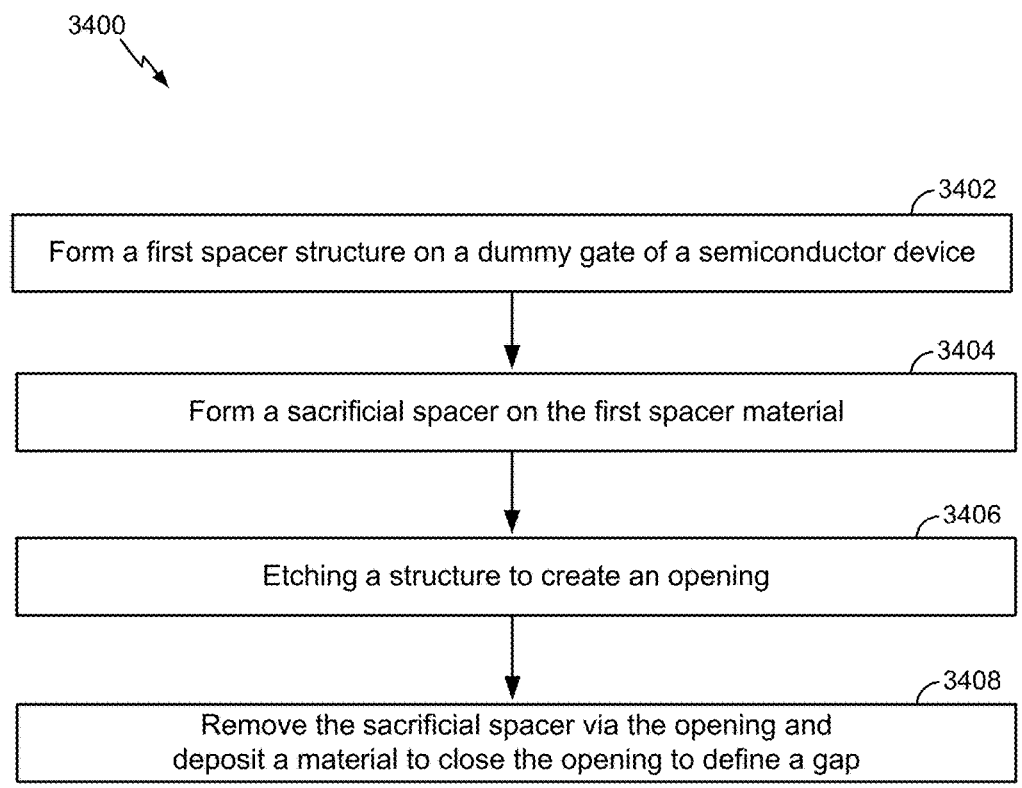
FIG. 34 is a flow diagram of an illustrative embodiment of a method of forming the semiconductor device of FIGS. 1A-B.

Referring to FIG. 34, a flow diagram of a first illustrative embodiment of a method 3400 of forming a semiconductor device is depicted. The semiconductor may include a field-effect transistor (FET), such as a FinFET that includes one or more fins, or a metal-oxide-semiconductor (MOS), such as a p-type metal-oxide-semiconductor (pMOS) or an n-type metal-oxide-semiconductor (nMOS) device, as illustrative, non-limiting examples. For example, the semiconductor device may include the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, or a semiconductor device formed according to the process illustrated by FIGS. 26-33.

The method 3400 includes forming a first spacer structure on a dummy gate of a semiconductor device, at 3402. The first spacer structure may include an oxide or a nitride. The dummy gate may be formed on a substrate of the semiconductor device. For example, the first spacer structure may include or correspond to the spacer 136 of FIGS. 1A-1B or the first spacer structure 136a of FIG. 1B and FIG. 4, or a combination thereof. The dummy gate may include or correspond to the dummy gate 304 of FIG. 3.

The method 3400 further includes forming a sacrificial spacer on the first spacer material, at 3404. The sacrificial spacer may include or correspond to the sacrificial spacer 522 of FIG. 5.

The method 3400 further includes etching a structure to create an opening, at 3406. The structure may be in contact with (e.g., adjacent to) the sacrificial spacer. Etching the structure may expose a portion of the sacrificial spacer. The structure may include a substrate (e.g., a fin portion of the substrate), such as the substrate 106 of FIGS. 1A-1B, or the structure may include the first spacer structure and/or a second spacer structure. The second spacer structure may include or correspond to the spacer 136 of FIGS. 1A-1B or the second spacer structure 136b of FIG. 1B and FIG. 6, or a combination thereof. The opening may correspond to the opening 712 of FIG. 7, the opening 1812 of FIG. 18, or the opening 3112 of FIG. 31.

The method 3400 further includes removing the sacrificial spacer via the opening and depositing a material to close the opening to define a gap, at 3408. The sacrificial spacer 522 may be removed using a chemical or reactive gas chemistry. For example, a hydrogen reaction or a standard clean 1 type may be used to remove the sacrificial spacer 522 without performing an etch operation. The material may be deposited by being epitaxially grown, such as epitaxially grown on a substrate. The material may include a source/drain material of the source/drain region 140 of FIGS. 1A-B or a material of a third spacer structure 136c of FIG. 1B. The gap may include or correspond to the gap 120 of FIGS. 1A-B. The gap may be defined by a portion of a source/drain region of the semiconductor device, such as the source/drain region 140 of FIGS. 1A-B. The gap may be positioned between a gate of the semiconductor device and a contact coupled to the source/drain region. The gap may reduce a parasitic capacitance associated with the semiconductor device.

In a particular embodiment, a second spacer structure may be formed on the sacrificial spacer. For example, the second spacer structure may be formed on a portion of the first spacer structure. A spacer (e.g., the spacer 136 of FIG. 1B) of the semiconductor device comprises at least the first spacer structure and the second spacer structure. The first spacer structure and the second spacer structure may include the same material. A portion of the material may be positioned between the first spacer structure and the second spacer structure. The first spacer structure and the second spacer structure may define the gap.

In another particular embodiment, the method 3400 may include establishing the opening. The opening may be created by removing a portion of a substrate, such as a portion of a fin of the semiconductor device (e.g., the opening 712 of FIG. 7). Alternatively, the opening may be created by removing a portion the first spacer structure, a portion of a second spacer structure, a portion of the sacrificial spacer, or a combination thereof (e.g., the opening 1812 of FIG. 18 or the opening 3112 of FIG. 31). For example, the opening by be defined by the first spacer structure, a second spacer structure, a dielectric layer, the dummy gate, or a combination thereof. As another example, the opening may be defined by the first spacer structure, a second spacer structure, a dielectric layer, a gate, or a combination thereof.

In another particular embodiment, the dummy gate may be removed to create a cavity, such as the cavity 1144 of FIG. 11, the cavity 2244 of FIG. 22, or the cavity 2744 of FIG. 27. For example, the dummy gate may be removed prior to removing the sacrificial spacer. As another example, the sacrificial spacer may be removed prior to removing the dummy gate. A gate may be formed in the cavity, such as the gate 150 of FIGS. 1A-B. The gate may be coupled to a channel region of the substrate, such as a channel included in a fin of the semiconductor device. The gate may include a high K material. A contact, such as the contact 148 of FIGS. 1A-B, may be formed subsequent to forming the gate. The contact may be electrically coupled to a source/drain region of the semiconductor device.

In a particular embodiment, the source/drain region is formed on a substrate of the semiconductor device and a dielectric layer, such as the dielectric material 180 of FIGS. 1A-B, is deposited on the source/drain region. A portion of the dielectric layer may be removed to create a cavity, such as the cavity 1346 of FIG. 13, the cavity 2446 of FIG. 24, or the cavity 2946 of FIG. 29, and the contact may be formed in the cavity. For example, the contact may be formed prior to removing the sacrificial spacer. As another example, the contact may be formed prior to removing the sacrificial spacer.

The method 3400 may be used to define a gap positioned between a gate and contact of a semiconductor device. The gap may reduce a parasitic capacitance (e.g., a gate capacitance, such as a capacitance between the gate and the contact). Additionally, the gap may provide an AC performance improvement as compared to a semiconductor device that does not have a defined gap.

Figure 35:
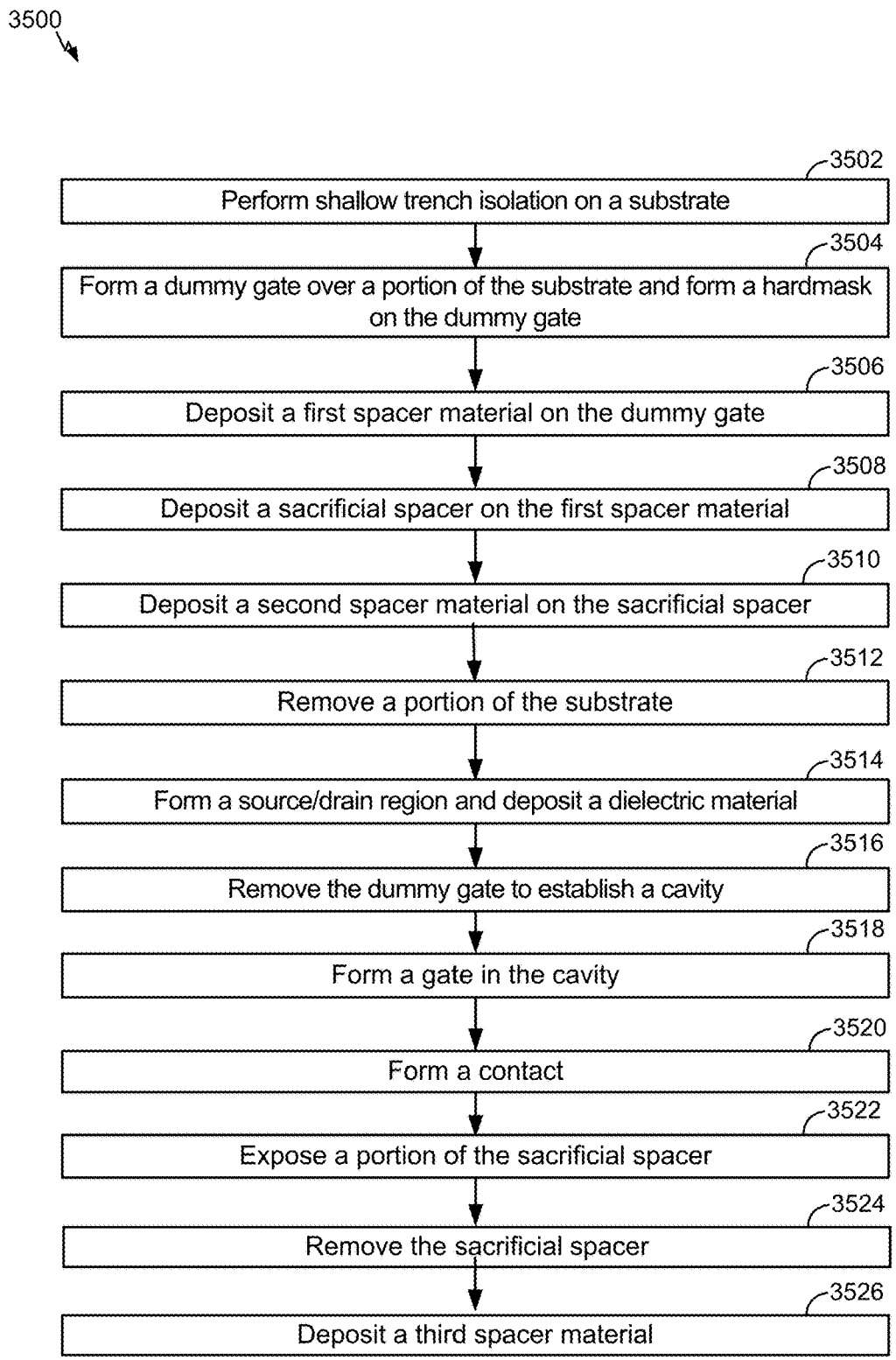
FIG. 35 is a flow diagram of a first illustrative embodiment of a method of forming the semiconductor device of FIG. 1B.

Referring to FIG. 35, a flow diagram of an illustrative embodiment of a method 3500 of forming a semiconductor device. For example, the semiconductor device may include the semiconductor device 160 of FIG. 1B or a semiconductor device formed according to the process illustrated by FIGS. 26-33.

The method 3500 may include performing shallow trench isolation on a substrate, at 3502. For example, the substrate may include or correspond to the substrate 106 of FIG. 1B, the wafer 202 of FIG. 2, or a combination thereof.

The method 3500 may further include forming a dummy gate over a portion of the substrate and forming a hardmask on the dummy gate, at 3504. The dummy gate and the hardmask may include or correspond to the dummy gate 304 and the hardmask 310 of FIG. 3, respectively.

The method 3500 may also include depositing a first spacer material on the dummy gate, at 3506. The first spacer material may be deposited directly on and/or may be in contact with the dummy gate. The first spacer material may include or correspond to the spacer 136 (e.g., the first spacer structure 136a) of FIG. 1B.

The method 3500 may further include depositing a sacrificial spacer on the first spacer material, at 3508. The sacrificial spacer may be deposited directly on and/or may be in contact with the first spacer material. The sacrificial spacer may include or correspond to the sacrificial spacer 522 of FIG. 5.

The method 3500 may also include depositing a second spacer material on the sacrificial spacer, at 3510. The second spacer may be deposited directly on and/or may be in contact with the first spacer material, the sacrificial spacer, or a combination thereof. The second spacer may include or correspond to the spacer 136 (e.g., the second spacer structure 136b) of FIG. 1B. An etch process may be performed after the second spacer material is deposited.

The method 3500 may further include removing a portion of the substrate, at 3512. The portion of the substrate that is removed may correspond to a source/drain region of the semiconductor device. Additionally or alternatively, the portion of the substrate that is removed may include or correspond to a portion of a fin of the substrate.

The method 3500 may also include forming a source/drain region and depositing a dielectric material, at 3514. The source/drain region and the dielectric material may include or correspond to the source/drain region 140 of FIG. 1B and the dielectric material 180 of FIG. 1B, respectively. After the dielectric material is deposited, a chemical mechanical planarization (CMP) process (e.g., a chemical mechanical polish) may be performed to remove a portion of the dielectric material and the hardmask. By removing the hardmask, the CMP may expose the dummy gate, such as a surface of the dummy gate.

The method 3500 may further include removing the dummy gate to establish a cavity, at 3516, and forming a gate in the cavity, at 3518. The cavity may include or correspond to the cavity 2744 of FIG. 27. The gate may include or correspond to the gate 150 of FIG. 1B.

The method 3500 may also include forming a contact, at 3520. To form the contact, a portion of the dielectric material may be removed to form a cavity (e.g., a trench), such as the cavity 2946 of FIG. 29, and the contact may be formed in the cavity. The contact may include or correspond to the contact 184 of FIG. 1B.

The method 3500 may further include exposing a portion of the sacrificial spacer, at 3522, and removing the sacrificial spacer, at 3524. The sacrificial spacer may be exposed by removing a portion of a spacer (including the first spacer material and the second spacer material). For example, removing the portion of the spacer may include removing a portion of the first spacer material, a portion of the second spacer material, or a combination thereof. Removal of the portion of the spacer may establish an opening, such as the opening 3112 of FIG. 31, through which the sacrificial spacer may be removed.

The method 3500 may also include depositing a third spacer material, at 3526. The third spacer material may be deposited to close (e.g., fill) the opening. Closing the opening may define a gap, such as an air-gap or a vacuum gap. The gap may include or correspond to the gap 120 of FIG. 1B. The third spacer material may include or correspond to the third spacer structure 136c. After the third spacer material is deposited, a CMP process may be performed to remove a portion of the third spacer material.

The method 3500 may be used to define a gap positioned between a gate and contact of a semiconductor device. The gap may reduce a parasitic capacitance (e.g., a gate capacitance, such as a capacitance between the gate and the contact). Additionally, the gap may provide an AC performance improvement as compared to a semiconductor device that does not have a defined gap.

Figure 36:
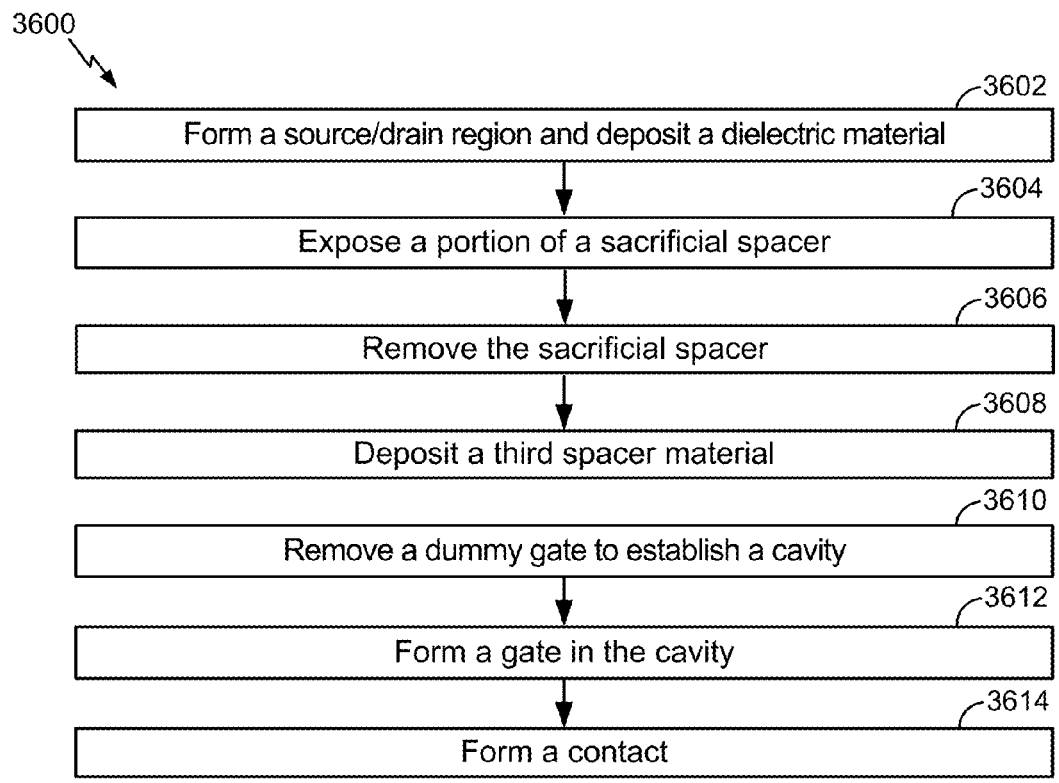
FIG. 36 is a flow diagram of a second illustrative embodiment of a method of forming the semiconductor device of FIG. 1B.

Referring to FIG. 36, a flow diagram of an illustrative embodiment of a method 3600 of forming a semiconductor device is depicted. For example, the semiconductor device may include the semiconductor device 160 of FIG. 1B or a semiconductor device formed according to the process illustrated by FIGS. 15-25.

The method 3600 may include forming a source/drain region and depositing a dielectric material, at 3602. The source/drain region and the dielectric material may include or correspond to the source/drain region 140 of FIG. 1B and the dielectric material 180 of FIG. 1B, respectively. After the dielectric material is deposited, a chemical mechanical planarization (CMP) process (e.g., a chemical mechanical polish) may be performed to remove a portion of the dielectric material and the hardmask. By removing the hardmask, the CMP may expose a dummy gate, such as a surface of the dummy gate. Alternatively or additionally, the CMP process may expose a spacer, such as a surface of a spacer formed by a first spacer material and a second spacer material. The first spacer material and the second spacer material may include or correspond to the first spacer structure 136a and the second spacer structure 136b of FIG. 1B, respectively.

The method 3600 may further include exposing a portion of a sacrificial spacer, at 3604, and removing the sacrificial spacer, at 3606. The sacrificial spacer may be exposed by removing a portion of a spacer (including the first spacer material and second spacer material). For example, removing the portion of the spacer may include removing a portion of the first spacer material, a portion of the second spacer material, or a combination thereof. Removal of the portion of the spacer may establish an opening, such as the opening 1812 of FIG. 18, through which the sacrificial spacer may be removed.

The method 3600 may also include depositing a third spacer material, at 3608. The third spacer material may be deposited to close (e.g., fill) the opening. Closing the opening may define a gap, such as an air-gap or a vacuum gap. The gap may include or correspond to the gap 120 of FIG. 1B. The third spacer material may include or correspond to the third spacer structure 136c of FIG. 1B. After the third spacer material is deposited, a CMP process may be performed to remove a portion of the third spacer material.

The method 3600 may also include removing a dummy gate to establish a cavity, at 3610, and forming a gate in the cavity, at 3612. The cavity may include or correspond to the cavity 2244 of FIG. 22. The gate may include or correspond to the gate 150 of FIG. 1B.

The method 3600 may further include forming a contact, at 3614. To form the contact, a portion of the dielectric material may be removed to form a cavity (e.g., a trench), such as the cavity 2446 of FIG. 24, and the contact may be formed in the cavity. The contact may include or correspond to the contact 184 of FIG. 1B.

The method 3600 may be used to define a gap positioned between a gate and contact of a semiconductor device. The gap may reduce a parasitic capacitance (e.g., a gate capacitance, such as a capacitance between the gate and the contact). Additionally, the gap may provide an AC performance improvement as compare to a semiconductor device that does not have a defined gap.

Figure 37:
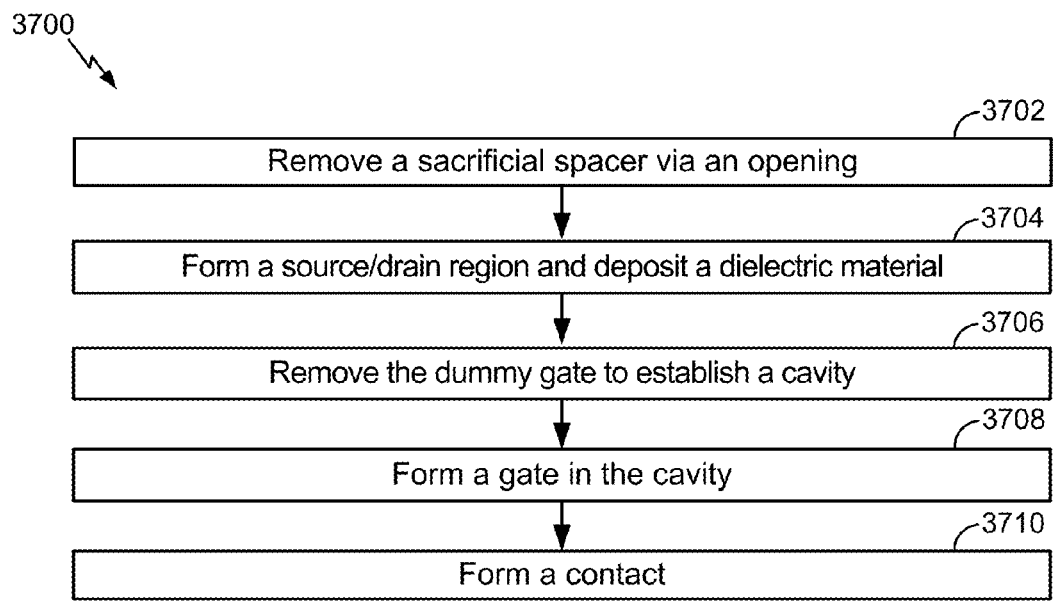
FIG. 37 is a flow diagram of an illustrative embodiment of a method of forming the semiconductor device of FIG. 1A.

Referring to FIG. 37, a flow diagram of an illustrative embodiment of a method 3700 of forming a semiconductor device is depicted. For example, the semiconductor device may include the semiconductor device 100 of FIG. 1A or a semiconductor device formed according to the process illustrated by FIGS. 2-14.

The method 3700 may include removing a sacrificial spacer via an opening, at 3702. The sacrificial spacer may include or correspond to the sacrificial spacer 522 of FIG. 5. The opening may include or correspond to the opening 712 of FIG. 7.

The method 3700 may further include forming a source/drain region and depositing a dielectric material, at 3704. The source/drain region may be formed by epitaxially growing a source/drain material. Forming the source/drain region may close the opening and define a gap, such as an air-gap or a vacuum gap. The source/drain region and the dielectric material may include or correspond to the source/drain region 140 of FIG. 1A and the dielectric material 180 of FIG. 1A, respectively. After the dielectric material is deposited, a chemical mechanical planarization (CMP) process (e.g., a chemical mechanical polish) may be performed to remove a portion of the dielectric material and the hardmask. By removing the hardmask, the CMP may expose the dummy gate, such as a surface of the dummy gate.

The method 3700 may also include removing a dummy gate to establish a cavity, at 3706, and forming a gate in the cavity, at 3708. The cavity may include or correspond to the cavity 1144 of FIG. 11. The gate may include or correspond to the gate 150 of FIG. 1A.

The method 3700 may further include forming a contact, at 3710. To form the contact, a portion of the dielectric material may be removed to form a cavity (e.g., a trench), such as the cavity 1346 of FIG. 13, and the contact may be formed in the cavity. The contact may include or correspond to the contact 184 of FIG. 1A.

The method 3700 may be used to define a gap positioned between a gate and contact of a semiconductor device. The gap may reduce a parasitic capacitance (e.g., a gate capacitance, such as a capacitance between the gate and the contact). Additionally, the gap may provide an AC performance improvement as compared to a semiconductor device that does not have a defined gap.

The methods of FIGS. 34-37 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the methods of FIG. 34-37 can be performed by one or more processors that execute instructions to control fabrication equipment.

Figure 38:
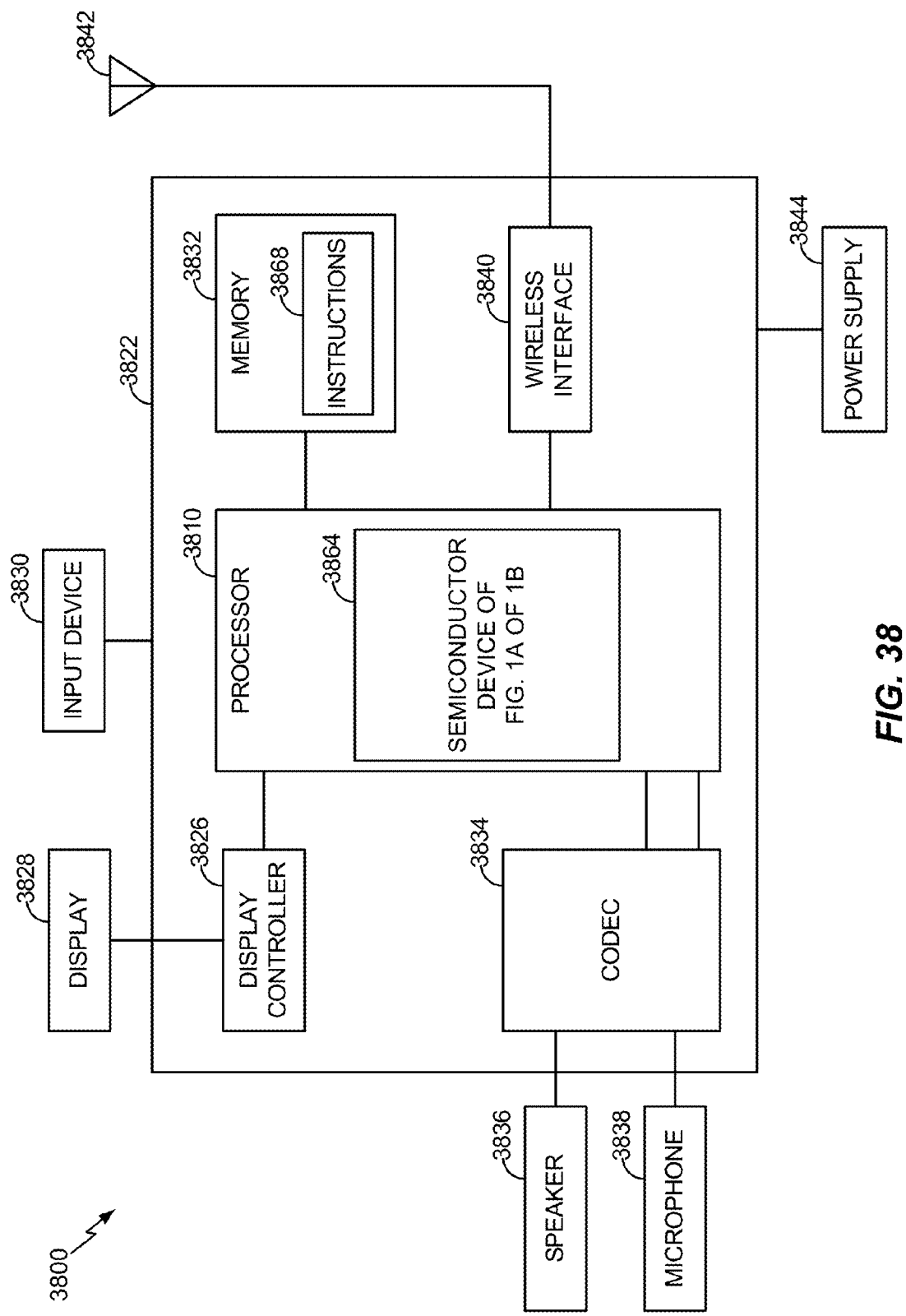
FIG. 38 is a block diagram of a device including the semiconductor device of FIG. 1A or FIG. 1B.

Referring to FIG. 38, a block diagram of a particular illustrative embodiment of a wireless communication device 3800 is depicted. The device 3800 may include the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof.

The device 3800 includes a processor 3810, such as a digital signal processor (DSP), coupled to a memory 3832. The processor 3810 may include a semiconductor device 3864. For example, the semiconductor device 3864 may be the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof.

The memory 3832 includes instructions 3868 (e.g., executable instructions) such as computer-readable instructions or processor-readable instructions. The instructions 3868 may include one or more instructions that are executable by a computer, such as the processor 3810.

FIG. 38 also shows a display controller 3826 that is coupled to the processor 3810 and to a display 3828. A coder/decoder (CODEC) 3834 can also be coupled to the processor 3810. A speaker 3836 and a microphone 3838 can be coupled to the CODEC 3834.

FIG. 38 also indicates that a wireless interface 3840, such as a wireless controller, can be coupled to the processor 3810 and to an antenna 3842. In a particular embodiment, the processor 3810, the display controller 3826, the memory 3832, the CODEC 3834, and the wireless interface 3840 are included in a system-in-package or system-on-chip device 3822. In a particular embodiment, an input device 3830 and a power supply 3844 are coupled to the system-on-chip device 3822. Moreover, in a particular embodiment, as illustrated in FIG. 38, the display 3828, the input device 3830, the speaker 3836, the microphone 3838, the antenna 3842, and the power supply 3844 are external to the system-on-chip device 3822. However, each of the display 3828, the input device 3830, the speaker 3836, the microphone 3838, the antenna 3842, and the power supply 3844 can be coupled to a component of the system-on-chip device 3822, such as an interface or a controller. Although the semiconductor device 3864 is depicted as being included in the processor 3810, the semiconductor device 3864 may be included in another component of the device 3800 or a component coupled to the device 3800. For example, the semiconductor device 3864 may be included in the memory 3832, the wireless interface 3840, the power supply 3844, the input device 3830, the display 3828, the display controller 3826, the CODEC 3834, the speaker 3836, or the microphone 3838.

In conjunction with one or more of the described embodiments of FIGS. 1-38, an apparatus is disclosed that may include means for activating a channel region of a semiconductor device. The channel region may be coupled to a source/drain region of the semiconductor device. The means for activating may correspond to the gate 150 of FIGS. 1A-1B, one or more other structures, devices, or circuits configured to activate the channel region, or any combination thereof.

The apparatus may also include means for conducting current. The means for conducting may be coupled to the source/drain region. The source/drain region may define a gap positioned between the means for activating and the means for conducting. A height of the gap is less than a height of the means for activating the channel region. The means for conducting may correspond to the contact 184 of FIG. 1A-B, one or more other, structures, devices, or circuits configured to conduct current, or any combination thereof.

In conjunction with the described embodiments of FIGS. 1-38, a method is disclosed that may include a first step for forming a first spacer structure on a dummy gate of a semiconductor device, such as described by the method 3400 of FIG. 34 at 3402 or the method 3500 of FIG. 35 at 3506, or by depositing a first spacer material of the first spacer structure on the dummy gate, by epitaxial growth of a first spacer material of the first spacer structure on the dummy gate, by one or more other processes configured to form the first spacer structure on the dummy gate of the semiconductor device, or any combination thereof.

The method may also include a second step for forming a sacrificial spacer on the first spacer structure, such as described by the method 3400 of FIG. 34 at 3404 or the method 3500 of FIG. 35 at 3508, or by depositing a sacrificial spacer material of the sacrificial spacer on the first spacer structure, by epitaxial growth of a sacrificial spacer material of the sacrificial spacer on the first spacer structure, by one or more other processes configured to form the sacrificial spacer on the first spacer structure, or any combination thereof.

The method may also include a third step of etching a structure to create an opening, such as described by the method 3400 of FIG. 34 at 3406, the method 3500 of FIG. 35 at 3522, the method 3600 of FIG. 36 at 3604, or by etching the structure, a portion of a substrate, a first spacer structure, and/or a second spacer structure to create the opening, by using a chemical or reactive gas chemistry to etch the structure, by one or more processes configured to etch the structure, or any combination thereof.

The method may also include a fourth step for removing the sacrificial spacer via the opening, such as described by the method 3400 of FIG. 34 at 3408, the method 3500 of FIG. 35 at 3524, the method 3600 of FIG. 36 at 3606, or the method 3700 of FIG. 37 at 3702, or by using a chemical, a hydrogen reaction, a standard clean 1 type, or reactive gas chemistry to remove the sacrificial spacer via the opening, by one or more other processes configured to remove the sacrificial spacer via the opening, or any combination thereof.

The method may also include a fifth step for depositing a material to close the opening. Removing the sacrificial spacer and depositing the material may define a gap. The fifth step for depositing the material may include performing the method 3400 of FIG. 34 at 3408, the method 3500 of FIG. 35 at 3526, the method 3600 of FIG. 36 at 3608, or the method 3700 of FIG. 37 at 3704, or by depositing a third spacer material associated with a third spacer structure to close the opening, by epitaxial growth of a third spacer material of a third spacer structure to close the opening, by depositing a source/drain material associated with a source/drain region to close the opening, by epitaxial growing a source/drain material associated with a source/drain region to close the opening, by one or more other processes configured to deposit the material to close the opening, or any combination thereof.

One or more of the disclosed embodiments may be implemented in a system or an apparatus, such as the device 3800, that may include a communications device, a fixed location data unit, a mobile location data unit, a mobile phone, a cellular phone, a satellite phone, a computer, a tablet, a portable computer, or a desktop computer. Alternatively or additionally, the device 3800 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 39:
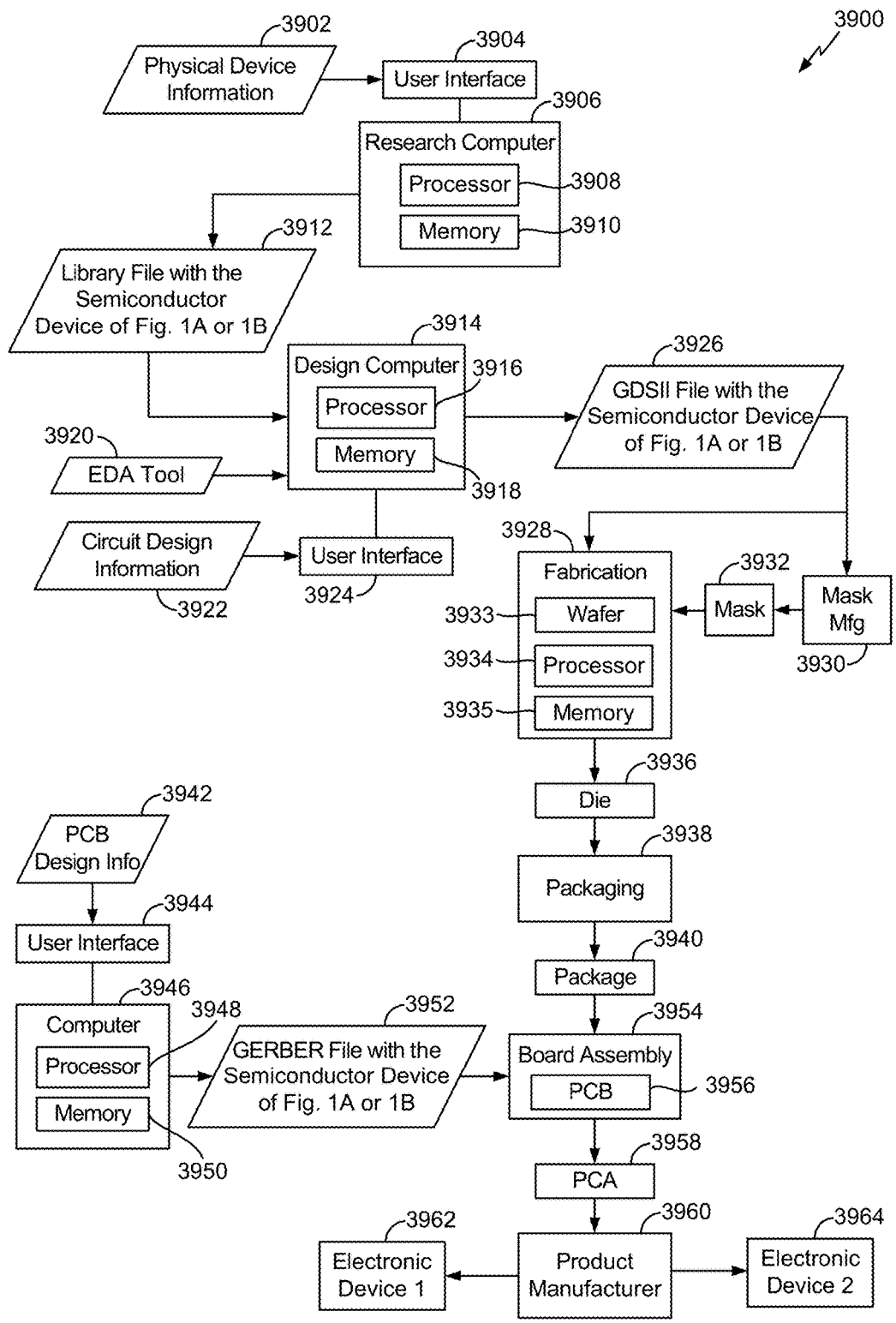
FIG. 39 is a data flow diagram of an illustrative embodiment of a manufacturing process to fabricate a device including the semiconductor device of FIG. 1A or FIG. 1B.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 39 depicts a particular illustrative embodiment of an electronic device manufacturing process 3900.

Physical device information 3902 is received at the manufacturing process 3900, such as at a research computer 3906. The physical device information 3902 may include design information representing at least one physical property of a semiconductor device, such as the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof. For example, the physical device information 3902 may include physical parameters, material characteristics, and structure information that is entered via a user interface 3904 coupled to the research computer 3906. The research computer 3906 includes a processor 3908, such as one or more processing cores, coupled to a computer-readable medium (e.g., a non-transitory computer-readable medium), such as a memory 3910. The memory 3910 may store computer-readable instructions that are executable to cause the processor 3908 to transform the physical device information 3902 to comply with a file format and to generate a library file 3912.

In a particular embodiment, the library file 3912 includes at least one data file including the transformed design information. For example, the library file 3912 may include a library of semiconductor devices including a device that includes the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, that is provided for use with an electronic design automation (EDA) tool 3920.

The library file 3912 may be used in conjunction with the EDA tool 3920 at a design computer 3914 including a processor 3916, such as one or more processing cores, coupled to a memory 3918. The EDA tool 3920 may be stored as processor executable instructions at the memory 3918 to enable a user of the design computer 3914 to design a circuit including the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, of the library file 3912. For example, a user of the design computer 3914 may enter circuit design information 3922 via a user interface 3924 coupled to the design computer 3914. The circuit design information 3922 may include design information representing at least one physical property of a semiconductor device, such as the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof. To illustrate, the circuit design property may include identification of particular circuits and relationships to other elements in a circuit design, positioning information, feature size information, interconnection information, or other information representing a physical property of a semiconductor device.

The design computer 3914 may be configured to transform the design information, including the circuit design information 3922, to comply with a file format. To illustrate, the file format may include a database binary file format representing planar geometric shapes, text labels, and other information about a circuit layout in a hierarchical format, such as a Graphic Data System (GDSII) file format. The design computer 3914 may be configured to generate a data file including the transformed design information, such as a GDSII file 3926 that includes information describing the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, in addition to other circuits or information. To illustrate, the data file may include information corresponding to a system-on-chip (SOC) that includes the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, and that also includes additional electronic circuits and components within the SOC.

The GDSII file 3926 may be received at a fabrication process 3928 to manufacture the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, according to transformed information in the GDSII file 3926. For example, a device manufacture process may include providing the GDSII file 3926 to a mask manufacturer 3930 to create one or more masks, such as masks to be used with photolithography processing, illustrated as a representative mask 3932. The mask 3932 may be used during the fabrication process to generate one or more wafers 3933, which may be tested and separated into dies, such as a representative die 3936. The die 3936 includes a circuit including a device that includes the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, or a combination thereof.

For example, the fabrication process 3928 may include a processor 3934 and a memory 3935 to initiate and/or control the fabrication process 3928. The memory 3935 may include executable instructions such as computer-readable instructions or processor-readable instructions. The executable instructions may include one or more instructions that are executable by a computer such as the processor 3934.

The fabrication process 3928 may be implemented by a fabrication system that is fully automated or partially automated. For example, the fabrication process 3928 may be automated according to a schedule. The fabrication system may include fabrication equipment (e.g., processing tools) to perform one or more operations to form a semiconductor device. For example, the fabrication equipment may be configured to deposit one or more materials, epitaxially grow one or more materials, conformally deposit one or more materials, apply a hardmask, apply an etching mask, perform etching, perform planarization, form a dummy gate stack, form a gate stack, perform a standard clean 1 type, etc.

The fabrication system (e.g., an automated system that performs the fabrication process 3928) may have a distributed architecture (e.g., a hierarchy). For example, the fabrication system may include one or more processors, such as the processor 3934, one or more memories, such as the memory 3935, and/or controllers that are distributed according to the distributed architecture. The distributed architecture may include a high-level processor that controls or initiates operations of one or more low-level systems. For example, a high-level portion of the fabrication process 3928 may include one or more processors, such as the processor 3934, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 3934.

Alternatively, the processor 3934 may be a part of a high-level system, subsystem, or component of the fabrication system. In another embodiment, the processor 3934 includes distributed processing at various levels and components of a fabrication system.

Thus, the processor 3934 may include processor-executable instructions that, when executed by the processor 3934, cause the processor 3934 to initiate or control formation of a semiconductor device, the semiconductor device formed by forming a first spacer structure on a dummy gate of a semiconductor device, by forming a sacrificial spacer on the first spacer structure, by removing the sacrificial spacer via an opening, and by depositing a material to close the opening where the material defines a gap. For example, the first spacer structure may be formed by one or more doping tools, such as molecular beam epitaxial growth tool, a flowable chemical vapor deposition (FCVD) tool, a conformal deposition tool, or a spin-on deposition tool. As another example, the sacrificial spacer may be formed by one or more deposition tools, such as molecular beam epitaxial growth tool, a flowable chemical vapor deposition (FCVD) tool, a conformal deposition tool, or a spin-on deposition tool. As another example, the sacrificial spacer may be removed by one or more removal tools, such as a chemical removal tool, a reactive gas removal tool, a hydrogen reaction removal tool, or a standard clean 1 type removal tool. As another example, the material may be deposited by one or more deposition tools, such as molecular beam epitaxial growth tool, a flowable chemical vapor deposition (FCVD) tool, a conformal deposition tool, or a spin-on deposition tool.

The executable instructions included in the memory 3935 may enable the processor 3934 to initiate formation of a semiconductor device such as the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof. In a particular embodiment, the memory 3935 is a non-transient computer-readable medium storing computer-executable instructions that are executable by the processor 3934 to cause the processor 3934 to initiate formation of a semiconductor device, such as field-effect transistor (FET) or a complementary metal-oxide-semiconductor (CMOS) device, in accordance with at least a portion of any of the processes illustrated FIGS. 2-33, at least a portion of any of the methods of FIGS. 34-37, or any combination thereof. For example, the computer executable instructions may be executable to cause the processor 3934 to initiate formation of the semiconductor device. The semiconductor device may be formed by forming a first spacer structure on a dummy gate of a semiconductor device, by forming a sacrificial spacer on the first spacer structure, by etching a structure to create an opening, by removing the sacrificial spacer via the opening, and by depositing a material to close the opening where the material defines a gap.

As an illustrative example, the processor 3934 may initiate or control a first step for forming a first spacer structure on a dummy gate of a semiconductor device. For example, the processor 3934 may be embedded in or coupled to one or more controllers that control one or more pieces of fabrication equipment to perform the first step for forming the first spacer structure on the dummy gate of the semiconductor device. The processor 3934 may control the first step for forming the first spacer structure on the dummy gate of the semiconductor device by controlling one or more processes as described by the method 3400 of FIG. 34 at 3402, the method 3500 of FIG. 35 at 3506, by controlling an epitaxial deposition of a first spacer material of the first spacer structure on the dummy gate, by controlling deposition of a first spacer material of the first spacer structure on the dummy gate, by controlling one or more other processes configured to form the first spacer structure on the dummy gate of the semiconductor device, or any combination thereof.

The processor 3934 may also control a second step for forming a sacrificial spacer on the first spacer structure. For example, the processor 3934 may be embedded in or coupled to one or more controllers that control one or more pieces of fabrication equipment to perform the second step forming the sacrificial spacer on the first spacer structure. The processor 3934 may control the second step for forming the sacrificial spacer on the first spacer structure device by controlling one or more processes as described by the method 3400 of FIG. 34 at 3404, the method 3500 of FIG. 35 at 3508, by controlling a deposition of a high mobility channel material in at least a cavity, by controlling an epitaxial growth of a high mobility material in a cavity, by controlling one or more other processes configured to form the sacrificial spacer on the first spacer structure, or any combination thereof.

The processor 3934 may also control a third step for etching a structure to create an opening. For example, the processor 3934 may be embedded in or coupled to one or more controllers that control one or more pieces of fabrication equipment to perform the third step for etching the structure to create the opening. The processor 3934 may control the third step for etching the structure to create the opening by controlling one or more processes as described by the method 3400 of FIG. 34 at 3406, the method 3500 of FIG. 35 at 3522, the method 3600 of FIG. 36 at 3604, or by etching the structure to create the opening, by etching a portion of a substrate to create the opening, by etching a portion of a first spacer structure to create the opening, by etching a portion of a second spacer structure to create the opening, by using a chemical to etch the structure, buy using reactive gas chemistry to etch the structure, by one or more processes configured to etch the structure, or any combination thereof.

The processor 3934 may also control a fourth step for removing the sacrificial spacer via the opening. For example, the processor 3934 may be embedded in or coupled to one or more controllers that control one or more pieces or components of fabrication equipment to perform the fourth step for removing the sacrificial spacer via the opening. The processor 3934 may control the fourth step for removing the sacrificial spacer via the opening by controlling one or more processes as described by the method 3400 of FIG. 34 at 3408, the method 3500 of FIG. 35 at 3524, the method 3600 of FIG. 36 at 3606, or the method 3700 of FIG. 37 at 3702, or by controlling removal of a sacrificial spacer material of the sacrificial spacer via the opening, by controlling use of a chemical to remove the sacrificial spacer via the opening, by controlling use of reactive gas chemistry to remove the sacrificial spacer via the opening, by controlling use of a hydrogen reaction to remove the sacrificial spacer via the opening, by controlling use of a standard clean 1 type to remove the sacrificial spacer via the opening, by controlling one or more other processes configured to remove the sacrificial spacer via the opening, or any combination thereof.

The processor 3934 may also control a fifth step for depositing a material to close the opening. For example, the processor 3934 may be embedded in or coupled to one or more controllers that control one or more pieces of fabrication equipment to perform the fifth step for depositing the material to close the opening. Removing the sacrificial spacer and depositing the material may define a gap. The processor 3934 may control the fifth step for depositing the material to close the opening by controlling one or more processes as described by the method 3400 of FIG. 34 at 3408, the method 3500 of FIG. 35 at 3526, the method 3600 of FIG. 36 at 3608, the method 3700 of FIG. 37 at 3704, by controlling deposition of a third spacer material associated with a third spacer structure to close the opening, by controlling an epitaxial growth of a third spacer material of a third spacer structure to close the opening, by controlling a deposition of a source/drain material associated with a source/drain region to close the opening, by controlling an epitaxial growth of a source/drain material associated with a source/drain region to close the opening, by controlling one or more other processes configured to deposit the material to close the opening, or any combination thereof.

The die 3936 may be provided to a packaging process 3938 where the die 3936 is incorporated into a representative package 3940. For example, the package 3940 may include the single die 3936 or multiple dies, such as a system-in-package (SiP) arrangement. The package 3940 may be configured to conform to one or more standards or specifications, such as Joint Electron Device Engineering Council (JEDEC) standards.

Information regarding the package 3940 may be distributed to various product designers, such as via a component library stored at a computer 3946. The computer 3946 may include a processor 3948, such as one or more processing cores, coupled to a memory 3950. A printed circuit board (PCB) tool may be stored as processor executable instructions at the memory 3950 to process PCB design information 3942 received from a user of the computer 3946 via a user interface 3944. The PCB design information 3942 may include physical positioning information of a packaged semiconductor device on a circuit board, the packaged semiconductor device corresponding to the package 3940 including the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof.

The computer 3946 may be configured to transform the PCB design information 3942 to generate a data file, such as a GERBER file 3952 with data that includes physical positioning information of a packaged semiconductor device on a circuit board, as well as layout of electrical connections such as traces and vias, where the packaged semiconductor device corresponds to the package 3940 including the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof. In other embodiments, the data file generated by the transformed PCB design information may have a format other than a GERBER format.

The GERBER file 3952 may be received at a board assembly process 3954 and used to create PCBs, such as a representative PCB 3956, manufactured in accordance with the design information stored within the GERBER file 3952. For example, the GERBER file 3952 may be uploaded to one or more machines to perform various steps of a PCB production process. The PCB 3956 may be populated with electronic components including the package 3940 to form a representative printed circuit assembly (PCA) 3958.

The PCA 3958 may be received at a product manufacture process 3960 and integrated into one or more electronic devices, such as a first representative electronic device 3962 and a second representative electronic device 3964. For example, the first representative electronic device 3962, the second representative electronic device 3964, or both, may include or correspond to the wireless communication device 3800 of FIG. 38. As an illustrative, non-limiting example, the first representative electronic device 3962, the second representative electronic device 3964, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 3962, the second representative electronic device 3964, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, is integrated. As another illustrative, non-limiting example, one or more of the electronic devices 3962 and 3964 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 39 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1A, the semiconductor device 160 of FIG. 1B, a semiconductor device formed according to the process illustrated by FIGS. 2-14, a semiconductor device formed according to the process illustrated by FIGS. 15-25, a semiconductor device formed according to the process illustrated by FIGS. 26-33, a semiconductor device formed using at least one of the methods of FIGS. 34-37, or a combination thereof, may be fabricated, processed, and incorporated into an electronic device, as described in the illustrative process 3900. One or more aspects of the embodiments disclosed with respect to FIGS. 1-38 may be included at various processing stages, such as within the library file 3912, the GDSII file 3926 (e.g., a file having a GDSII format), and the GERBER file 3952 (e.g., a file having a GERBER format), as well as stored at the memory 3910 of the research computer 3906, the memory 3918 of the design computer 3914, the memory 3950 of the computer 3946, the memory of one or more other computers or processors (not shown) used at the various stages, such as at the board assembly process 3954, and also incorporated into one or more other physical embodiments such as the mask 3932, the die 3936, the package 3940, the PCA 3958, other products such as prototype circuits or devices (not shown), or any combination thereof. Although various representative stages of production from a physical device design to a final product are depicted, in other embodiments fewer stages may be used or additional stages may be included. Similarly, the process 3900 may be performed by a single entity or by one or more entities performing various stages of the process 3900.

Although one or more of FIGS. 1-39 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Although one or more of FIGS. 1-39 may illustrate systems, apparatuses, and/or methods according to the teachings of the disclosure, the disclosure is not limited to these illustrated systems, apparatuses, and/or methods. One or more functions or components of any of FIGS. 1-39 as illustrated or described herein may be combined with one or more other portions of another of FIGS. 1-39. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of forming a semiconductor device, the method comprising:
    forming a first spacer structure on a dummy gate;
    forming a sacrificial spacer on the first spacer structure;
    etching a portion of a fin to create an opening; and
    removing the sacrificial spacer via the opening and depositing a material to close the opening to define a gap.

2. The method of claim 1, wherein etching the portion of the fin exposes a portion of the sacrificial spacer.

3. The method of claim 1, wherein the gap is further defined by a sidewall of the first spacer structure, the sidewall of the first spacer structure in contact with the dummy gate.

4. The method of claim 1, wherein etching the portion of the fin includes etching a structure that includes the first spacer structure, a second spacer structure, or both, and wherein etching the structure includes removing a portion of the first spacer structure, a portion of the second spacer structure, or a combination thereof.

5. The method of claim 4, wherein the material corresponds to a third spacer structure, wherein the third spacer structure is in contact with the first spacer structure, the second spacer structure, or both.

6. The method of claim 5, wherein a spacer of the semiconductor device comprises the first spacer structure, the second spacer structure, and the third spacer structure.

7. The method of claim 1, wherein the material corresponds to a source/drain region material of a source/drain region of the semiconductor device, and wherein depositing the material comprises epitaxially growing the source/drain region of the semiconductor device.

8. The method of claim 1, wherein the opening is defined by the first spacer structure, a second spacer structure, a dielectric layer, the dummy gate, or a combination thereof.

9. The method of claim 1, further comprising replacing the dummy gate with a gate, and wherein the opening is defined by the first spacer structure, a second spacer structure, a dielectric layer, the gate, or a combination thereof.

10. The method of claim 1, further comprising forming a second spacer structure on the sacrificial spacer.

11. The method of claim 10, wherein a portion of the second spacer structure is formed on a portion of the first spacer structure.

12. The method of claim 10, wherein a portion of the material is positioned between the first spacer structure and the second spacer structure.

13. The method of claim 10, wherein the first spacer structure includes a first material, and wherein the second spacer structure includes the first material.

14. The method of claim 10, wherein a spacer of the semiconductor device comprises the first spacer structure and the second spacer structure.

15. A non-transitory computer-readable medium comprising processor-executable instructions that, when executed by a processor, cause the processor to:
  initiate formation of a semiconductor device, the semiconductor device formed by:
    forming a first spacer structure on a dummy gate;
    forming a sacrificial spacer on the first spacer structure;
    etching a portion of a fin to create an opening; and
    removing the sacrificial spacer via the opening and depositing a material to close the opening to define a gap.

16. The non-transitory computer-readable medium of claim 15, wherein the semiconductor device is further formed by:
  forming the dummy gate on a substrate of the semiconductor device;
  removing the dummy gate to create a cavity; and
  forming a gate in the cavity, wherein the gate is coupled to a channel region of the semiconductor device.

17. The non-transitory computer-readable medium of claim 16, wherein the channel region is included in the fin of the substrate.

18. The non-transitory computer-readable medium of claim 16, wherein the dummy gate is removed prior to removing the sacrificial spacer.

19. The non-transitory computer-readable medium of claim 16, wherein the sacrificial spacer is removed prior to removing the dummy gate.

20. The non-transitory computer-readable medium of claim 16, wherein the semiconductor device is further formed by forming a contact subsequent to forming the gate, wherein the contact is electrically coupled to a source/drain region of the semiconductor device.

21. The non-transitory computer-readable medium of claim 15, wherein the semiconductor device is further formed by:
  forming a source/drain region on a substrate of the semiconductor device;
  forming a dielectric layer on the source/drain region;
  removing a portion of the dielectric layer to create a cavity; and
  forming a contact in the cavity, wherein the contact is electrically coupled to the source/drain region.

22. The non-transitory computer-readable medium of claim 21, wherein the contact is formed prior to removing the sacrificial spacer.

23. The non-transitory computer-readable medium of claim 21, wherein the sacrificial spacer is removed prior to forming the contact.

* * * * *